(12) United States Patent
Furukawa et al.

(10) Patent No.: US 11,598,791 B2
(45) Date of Patent: *Mar. 7, 2023

(54) CURRENT DETECTION APPARATUS AND MANUFACTURING METHOD OF THE SAME

(71) Applicant: Mitsubishi Electric Corporation, Tokyo (JP)

(72) Inventors: Akira Furukawa, Tokyo (JP); Kenichi Akita, Tokyo (JP); Daisuke Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 387 days.

This patent is subject to a terminal disclaimer.

(21) Appl. No.: 16/854,986

(22) Filed: Apr. 22, 2020

(65) Prior Publication Data

US 2020/0400720 A1 Dec. 24, 2020

(30) Foreign Application Priority Data

Jun. 19, 2019 (JP) .............................. JP2019-113322

(51) Int. Cl.
*G01R 15/20* (2006.01)
*G01R 19/00* (2006.01)

(52) U.S. Cl.
CPC ......... *G01R 15/20* (2013.01); *G01R 19/0092* (2013.01)

(58) Field of Classification Search
CPC ............................ G01R 15/20; G01R 19/0092
See application file for complete search history.

(56) References Cited

U.S. PATENT DOCUMENTS

| 6,072,287 A | * | 6/2000 | Gataric | ...................... H02P 5/74 |
| | | | | 318/41 |
| 2002/0097015 A1 | * | 7/2002 | Kitajima | ................... H02P 6/10 |
| | | | | 318/432 |
| 2007/0216339 A1 | * | 9/2007 | Yoshimoto | .............. B60L 58/40 |
| | | | | 318/800 |

(Continued)

FOREIGN PATENT DOCUMENTS

| JP | 2018-096795 | A | 6/2018 | |
| JP | 2018096795 | | * 6/2018 | ............. G01R 15/20 |

(Continued)

*Primary Examiner* — Alexander Satanovsky
*Assistant Examiner* — Sharah Zaab
(74) *Attorney, Agent, or Firm* — Sughrue Mion, PLLC; Richard C. Turner

(57) ABSTRACT

Magnetic sensors each disposed to face each of current paths for each of windings with 2n phases (n is a multiple of three) in an AC rotating machine are included, and when each of a DC component and an AC component in a d-axis sum current and a q-axis sum current obtained by performing a dq-transformation into a two-axis coordinate system on 2n detection currents on the assumption that all current amplitudes of the windings are the same is represented collectively with each of terms expressed by sine functions with different phases to one another, each of the current paths at each of 2n current path arrangement positions is arranged to have a positional relationship where error components are reduced by cancellation among coefficients included at least in one of the terms or by cancellation among values of the terms.

32 Claims, 20 Drawing Sheets

(56) References Cited

U.S. PATENT DOCUMENTS

2015/0176964 A1* 6/2015 Uberti ................ G01R 33/0029
702/95
2016/0169941 A1* 6/2016 Fukui ................... G01R 15/207
324/117 R

FOREIGN PATENT DOCUMENTS

JP          2019013059    *  1/2019  ............. H02M 7/48
WO       2017/187813 A1    11/2017

* cited by examiner

|  | X11 | X21 | X12 | X22 | X13 | X23 |
|---|---|---|---|---|---|---|
| C1 | U1 | W2 | V1 | U2 | W1 | V2 |
| C2 | U1 | W2 | V1 | V2 | W1 | U2 |
| C3 | U1 | V2 | V1 | W2 | W1 | U2 |
| C4 | U1 | V2 | V1 | U2 | W1 | W2 |
| C5 | U1 | U2 | V1 | V2 | W1 | W2 |
| C6 | U1 | U2 | V1 | W2 | W1 | V2 |

|  | X11 | X21 | X12 | X22 | X13 | X23 |
|---|---|---|---|---|---|---|
| C1 | U1 | U2 | V1 | V2 | W1 | W2 |
| C2 | U1 | W2 | V1 | V2 | W1 | U2 |

FIG. 12

|    | X11 | X12 | X13 | X21 | X22 | X23 |
|----|-----|-----|-----|-----|-----|-----|
| C1 | U1  | V1  | W1  | U2  | V2  | W2  |
| C2 | U1  | V1  | W1  | W2  | V2  | U2  |

|    | X11 | X21 | X12 | X22 | X13 | X23 |
|----|-----|-----|-----|-----|-----|-----|
| C1 | U1  | W2  | V1  | U2  | W1  | V2  |
| C2 | U1  | W2  | V1  | V2  | W1  | U2  |
| C3 | U1  | V2  | V1  | W2  | W1  | U2  |
| C4 | U1  | V2  | V1  | U2  | W1  | W2  |
| C5 | U1  | U2  | V1  | V2  | W1  | W2  |
| C6 | U1  | U2  | V1  | W2  | W1  | V2  |

CURRENT DETECTION APPARATUS AND MANUFACTURING METHOD OF THE SAME

TECHNICAL FIELD

The present application relates to a current detection apparatus.

BACKGROUND ART

For example, in a current detection apparatus that uses a magnetic sensor to detect a current of a winding for each phase of an AC rotating machine having two sets of three-phase windings, a current detection error occurs owing to the influence of the disturbance magnetic field from currents of other phases on the magnetic sensor of each winding. Thus, various configurations for reducing the error have been proposed.

In the current detection sensor described in Patent Document 1, a first magnetic sensor and a second magnetic sensor are disposed in such a manner that the current flow direction in a first opposed part and a second opposed part is opposite to each other, and thus the current detection error generated by the disturbance magnetic field is reduced. In the current detection device described in Patent Document 2, a correction current in accordance with the magnitude of the magnetic flux influenced by other phases is caused to flow through a correction conductor, so that a current detection error due to the influence of the magnetic flux of the adjacent other phases is reduced.

CITATION LIST

Patent Document

Patent Document 1: Unexamined Japanese Patent Application Publication No. 2018-96795
Patent Document 2: International Publication of Unexamined Application No. WO2017/187813

SUMMARY OF INVENTION

Technical Problem

The current detection sensor described in Patent Document 1 requires two magnetic sensors to detect a current of one phase. For example, in the case of a motor having two sets of three-phase windings, twelve magnetic sensors are required, so that more space is required in comparison with the case where a current of each phase is detected by one detection device.

Further, in the current detection device described in Patent Document 2, correction conductors for correction currents to flow are required, and thus more space is required and temperature rise due to the heating of the correction conductors is likely to occur in comparison with the case where the correction conductors are not mounted. In order to use parts within the permissible temperature range, the amount of current is needed to be limited at a high temperature in order to suppress temperature rise. In the usage under a thermally harsh environment, output torque is limited earlier owing to the heating of the correction conductors.

In the present application, a technique to overcome the problems described above is disclosed, and an object is to provide a current detection apparatus that requires less space and has a small current detection error.

Solution to Problem

A current detection apparatus disclosed in the present application includes magnetic sensors each disposed to face each of current paths for each of windings with 2n phases (n is a multiple of three) in an AC rotating machine. Each of the magnetic sensors is disposed to face each of the current paths at each of 2n current path arrangement positions, a detection current $i_{ks}$ that is detected by a magnetic sensor disposed to face a current path of a k-phase is represented by Formula (a) using a current $I_l$ of an l-phase (l=1 to 2n) being a l-th phase out of the 2n phases and using $a_{l\_k}$ that is a coupling coefficient between a current path of the l-phase and the magnetic sensor disposed to face the current path of the k-phase (k=1 to 2n) being the k-th phase out of the 2n phases, and $$i_{ks} = \sum_{l=1}^{2n} a_{l\_k} \times I_l \ (k = 1 \sim 2n) \tag{a}$$

in a d-axis sum current and a q-axis sum current that are currents obtained by performing a dq-transformation into a two-axis coordinate system on 2n detection currents $i_{ks}$ on an assumption that all amplitudes of $I_l$ are the same, and when each of a DC component and an AC component in the sum currents is represented collectively with each of terms expressed by sine functions with different phases to one another, the current paths are arranged to have a positional relationship that satisfies at least one condition out of a first condition in which, at least in one of the terms, an amplitude in the one term corresponding to one of error components is reduced by cancellation among coefficients $a_{l\_k}$ included in the one term, where l≠k, and a second condition in which the error components are reduced by cancellation among values of the terms of sine functions with different phases.

Further, being disclosed in the present application, a manufacturing method for a current detection apparatus includes the steps of:

setting 2n current path arrangement positions as positions for setting 2n current paths in which each of the magnetic sensors is disposed to face each of the 2n current paths;

assigning each of the 2n current paths to which each of the magnetic sensors is disposed to face, at each of the 2n current path arrangement positions that are set, so as to satisfy at least one of conditions, wherein, in a case where a detection current $i_{ks}$ that is detected by a magnetic sensor disposed to face a current path of a k-phase is represented by Formula (b) using a current $I_l$ of an l-phase (l=1 to 2n) being a l-th phase out of the 2n phases and using $a_{l\_k}$ that is a coupling coefficient between a current path of the l-phase and the magnetic sensor disposed to face the current path of the k-phase (k=1 to 2n) being the k-th phase out of the 2n phases, $$i_{ks} = \sum_{l=1}^{2n} a_{l\_k} \times I_l \ (k = 1 \sim 2n) \tag{b}$$

and in a d-axis sum current and a q-axis sum current that are currents obtained by performing a dq-transformation into a two-axis coordinate system on 2n detection currents $i_{ks}$ on an assumption that all amplitudes of $I_l$ are the same, and when each of a DC component and an AC component in the sum currents is represented collectively with each of terms expressed by sine functions with different phases to one another, the conditions are a first condition in which, at least in one of the terms, an amplitude in the one term corresponding to one of error components is reduced by cancellation among coefficients $a_{l\_k}$ included in the one term, where l≠k, and a second condition in which the error components are reduced by cancellation among values of the terms of sine functions with different phases; and arranging each of the current paths to which each of the magnetic sensors is disposed to face, at the current path arrangement positions assigned in the step of assigning each of the 2n current paths.

Advantageous Effects of Invention

According to the current detection apparatus and the manufacturing method thereof disclosed in the present application, a current detection apparatus that requires less space and has a small detection error can be obtained.

BRIEF DESCRIPTION OF DRAWINGS

FIG. 12 is a diagram showing a table for explaining assignment of current path arrangement in the current detection apparatus according to the first embodiment.

DESCRIPTION OF EMBODIMENTS

First Embodiment

Figure 1:
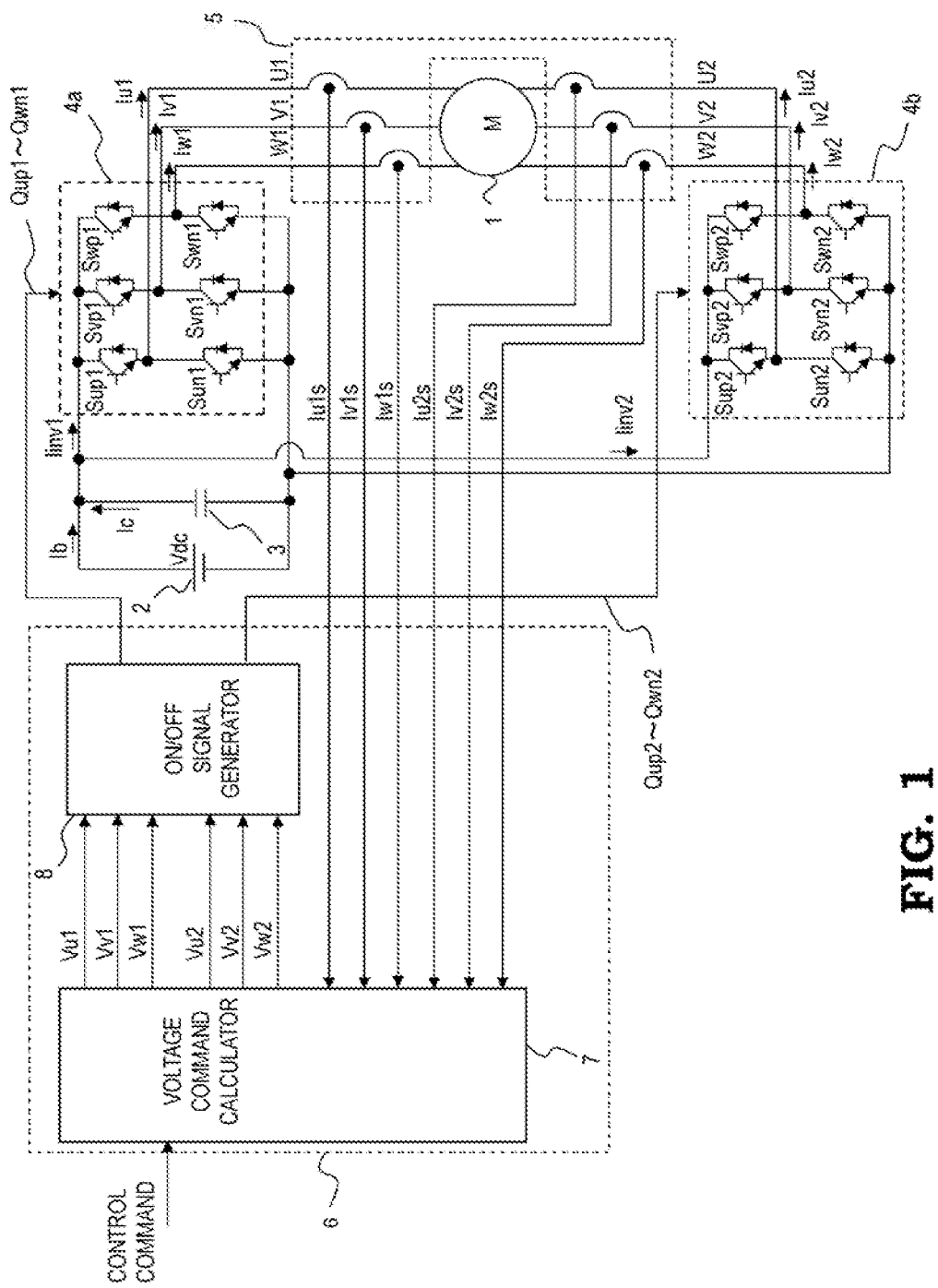
FIG. 1 is a diagram showing an overall configuration of an electric drive system including a current detection apparatus according to a first embodiment.

Hereinafter, each embodiment will be described on the basis of the drawings. In each of the drawings, the same or corresponding members and parts will be described with the same reference numerals.

FIG. 1 is a diagram showing an overall configuration of an electric drive system including a current detection apparatus according to a first embodiment. As shown in FIG. 1, the electric drive system includes a smoothing capacitor 3, a first power converter 4a, a second power converter 4b, and a controller 6. The power converters are connected to a DC power source 2 serving as a power supply. Further, as a load, an AC rotating machine 1 is connected to the power converters. Each power converter converts a DC voltage from the DC power source 2 into an AC voltage and supplies the AC voltage to the AC rotating machine 1.

Figure 2:
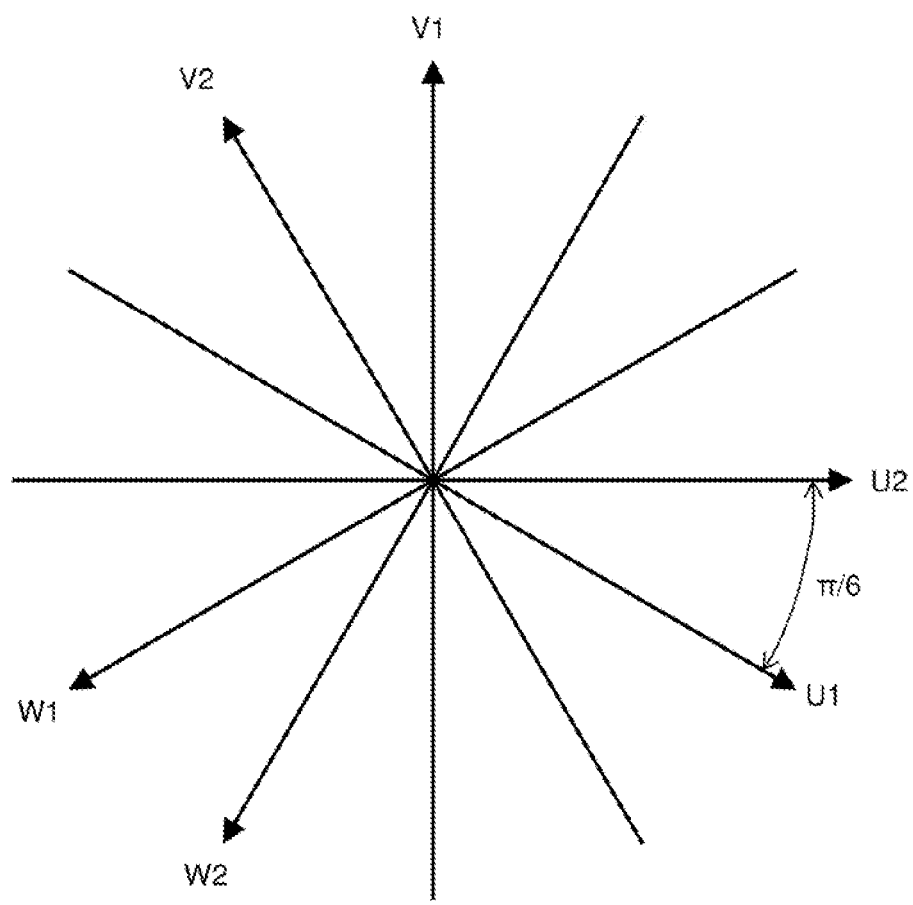
FIG. 2 is a diagram showing a relationship between current phases in the current detection apparatus according to the first embodiment.

The AC rotating machine 1 is a three-phase AC rotating machine that has a first three-phase windings U1, V1, and W1, and a second three-phase windings U2, V2, and W2. The first three-phase windings U1, V1, and W1 and the second three-phase windings U2, V2, and W2 are housed in a stator of the AC rotating machine 1 without being electrically connected to each other. Examples of the three-phase AC rotating machine include a permanent magnet synchronous rotating machine, an induction rotating machine, and a synchronous reluctance rotating machine. The present application can be applied to any kind of AC rotating machine that has windings with 2n phases (n is a multiple of three). In the first embodiment, description will be made assuming that a phase difference between the first three-phase windings and the second three-phase windings is π/6 as shown in FIG. 2 (that is, the phase differences between U1 and U2, V1 and V2, and W1 and W2 are each π/6, the unit is rad (radian), and hereinafter the unit is rad when a phase unit is not stated).

The DC power source 2 outputs a DC voltage Vdc to the power converters 4a and 4b. The DC power source 2 may have any configuration, such as a battery, a DC-DC converter, a diode rectifier, and a PWM rectifier, as long as it is a DC power source that outputs a DC voltage. The smoothing capacitor 3 is connected to the DC power source 2 in parallel to suppress fluctuation of a bus bar current, so that a stable DC current can be obtained.

Using an inverter circuit (inverter) and by turning on/off high potential-side switching devices Sup1, Svp1, and Swp1 and low potential-side switching devices Sun1, Svn1, and Swn1 on the basis of on/off signals Qup1 to Qwn1, the power converter 4a converts the DC voltage Vdc inputted from the DC power source 2 into AC voltages by power conversion to apply the AC voltages to three-phase windings U1, V1, and W1 of the AC rotating machine 1, and supplies currents Iu1, Iv1, and Iw1. Here, in the power converter 4a, the on/off signals Qup1, Qun1, Qvp1, Qvn1, Qwp1, and Qwn1 are signals to turn on/off Sup1, Sun1, Svp1, Svn1, Swp1, and Swn1, respectively. As semiconductor switches for Sup1 to Swn1, semiconductor switches such as insulated gate bipolar transistors (IGBT), bipolar transistors, and metal oxide semiconductor (MOS) power transistors, and diodes connected thereto in antiparallel are used.

Using an inverter circuit (inverter) and by turning on/off high potential-side switching devices Sup2, Svp2, and Swp2 and low potential-side switching devices Sun2, Svn2, and Swn2 on the basis of on/off signals Qup2 to Qwn2, the power converter 4b converts the DC voltage Vdc inputted from the DC power source 2 into AC voltages by power conversion to apply the AC voltages to three-phase windings U2, V2, and W2 of the AC rotating machine 1, and supplies currents Iu2, Iv2, and Iw2. Here, in the power converter 4b, the on/off signals Qup2, Qun2, Qvp2, Qvn2, Qwp2, and Qwn2 are signals to turn on/off Sup2, Sun2, Svp2, Svn2, Swp2, and Swn2, respectively. Hereinafter, it is assumed that, in Qup1 to Qwn1, if the value is one, a signal for turning on a corresponding switch is outputted, and if the value is zero, a signal for turning off a corresponding switch is outputted. As semiconductor switches for Sup2 to Swn2, semiconductor switches such as insulated gate bipolar transistors (IGBT), bipolar transistors, and metal oxide semiconductor (MOS) power transistors, and diodes connected thereto in antiparallel are used.

The current detection apparatus 5 detects values of currents Iu1, Iv1, and Iw1 flowing through three-phase windings U1, V1, and W1 of the AC rotating machine 1 as current detection values $i_{u1s}$, $i_{v1s}$, and $i_{w1s}$, respectively, and detects values of currents Iu2, Iv2, and Iw2 flowing through three-phase windings U2, V2, and W2 of the AC rotating machine 1 as current detection values $i_{u2s}$, $i_{v2s}$, and $i_{w2s}$, respectively. As shown in FIG. 1, the current detection apparatus 5 is provided between the power converter 4a and the three-phase windings of the AC rotating machine 1, and between the power converter 4b and the three-phase windings of the AC rotating machine 1, thereby bringing about an effect of enabling to detect currents at all times regardless of the conditions of the switching devices in the power converters 4a and 4b. If the current detection apparatus 5 is provided in series with the low potential-side switching devices, the currents are to be detected when the low potential-side switching devices are turned on. Thus, in a case of a high modulation ratio, a situation occurs in which a current for any one of the phases cannot be detected. By limiting the output, it is possible to avoid the situation where the current detection is not possible in a part of the phases. However, the output torque is reduced. That is, the configuration in which the current detection apparatus 5 is disposed in the position indicated in FIG. 1 makes it possible to obtain the maximum output by determining the on/off of the switching devices without considering whether or not the current detection is possible, and thus is suitable for the present embodiment.

Next, the controller 6 that includes a voltage command calculator 7 and an on/off signal generator 8 will be described. The controller 6 is, for example, is implemented by a microcomputer that performs arithmetic processing, a read only memory (ROM) that stores data such as program data and fixed-value data, and a random access memory (RAM) in which stored data is updated and rewritten sequentially.

On the basis of a control command inputted from the outside, the voltage command calculator 7 calculates first three-phase voltage commands Vu1, Vv1, and Vw1 that are related to voltages for driving the AC rotating machine 1 and for application to the first three-phase windings U1, V1, and W1, calculates second three-phase voltage commands Vu2, Vv2, and Vw2 that are related to voltages for driving the AC rotating machine 1 and for application to the second three-phase windings U2, V2, and W2, and outputs them to the on/off signal generator 8. As a method for the calculation of the first three-phase voltage commands Vu1, Vv1, and Vw1 and the second three-phase voltage commands Vu2, Vv2, and Vw2 in the voltage command calculator 7, for example, a current feedback control or the like is used. Note that, in order to improve a voltage utilization factor, a known modulation method such as the spatial vector modulation method or the two-phase modulation method may be used.

The on/off signal generator 8 generates a signal for applying the pulse width modulation (PWM modulation) to each of the semiconductor switches of the power converter 4a and the power converter 4b. Specifically, on the basis of the first three-phase voltage commands Vu1, Vv1, and Vw1, on/off signals Qup1, Qun1, Qvp1, Qvn1, Qwp1, and Qwn1 having pulse widths in response to the voltage commands Vu1, Vv1, and Vw1 are outputted, and on the basis of the second three-phase voltage commands Vu2, Vv2, and Vw2, on/off signals Qup2, Qun2, Qvp2, Qvn2, Qwp2, and Qwn2 having pulse widths in response to the voltage commands Vu2, Vv2, and Vw2 are outputted.

Figure 3:
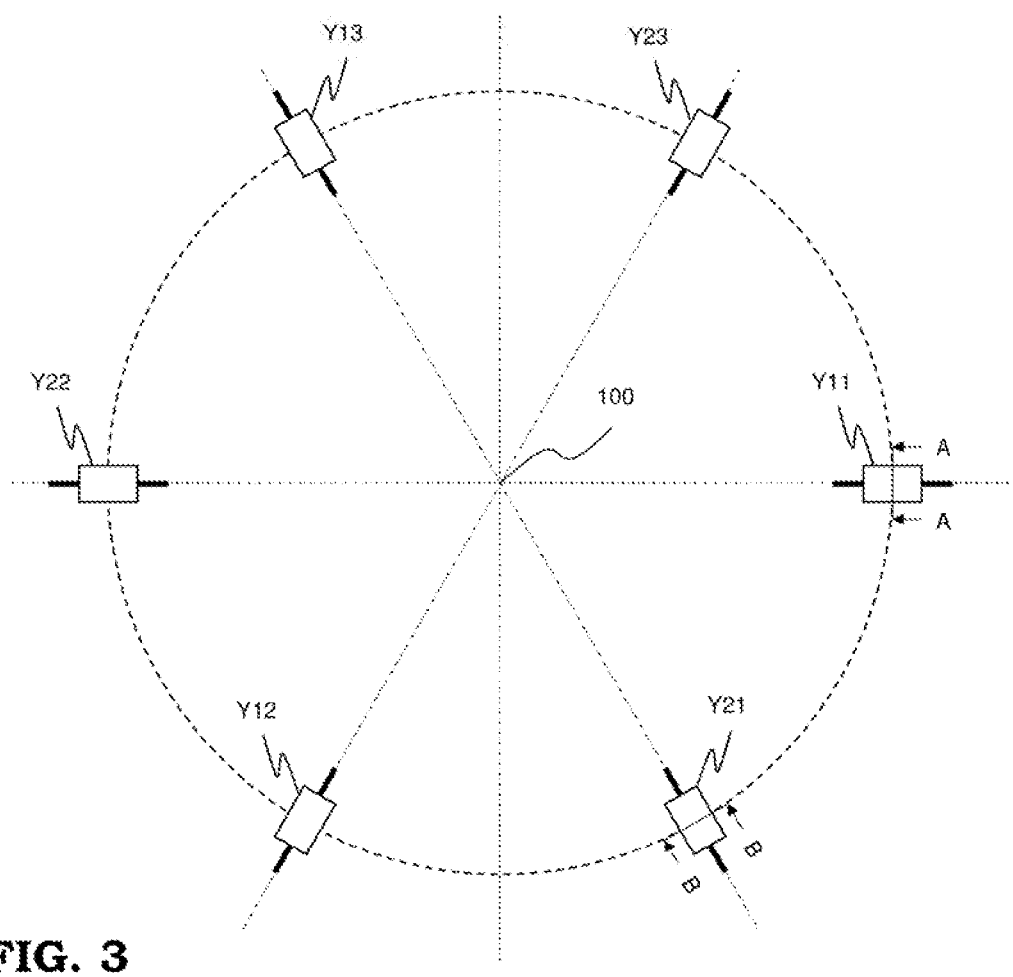
FIG. 3 is a diagram showing current path arrangement positions in the current detection apparatus according to the first embodiment.
Figure 4:
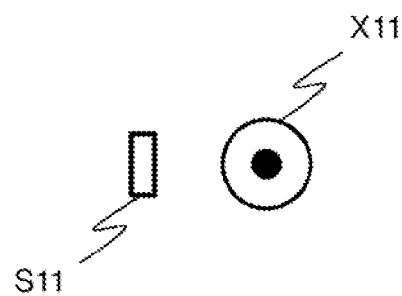
FIG. 4 is a diagram showing an example of a positional relationship between a current path and a magnetic sensor in the current detection apparatus according to the first embodiment.

FIG. 3 is a schematic diagram showing arrangement positions of current detectors in the current detection apparatus 5 as viewed from the direction in which a rotor axis 100 of the AC rotating machine 1 extends. Hereinafter, a position where a current detector is configured by disposing a magnetic sensor to face a current path of each phase is referred to as a current path arrangement position. As shown in FIG. 3, the first current path arrangement positions and the second current path arrangement positions are alternately arranged at equal intervals on a circle with respect to the rotor axis 100. Here, although the first current path arrangement positions and the second current path arrangement positions are set on the same circle, if the arrangement is made in such a way that the first current path arrangement positions and the second current path arrangement positions are set on respective concentric circles having different radii, and an angle formed by lines connecting two adjacent current path arrangement positions to the center, that is, an arrangement angle of adjacent two current path arrangement positions with respect to the center is the same for all of the adjacent current path arrangement positions, the same advantageous effect can be obtained. The current detection apparatus 5 is constituted by six current detectors that are arranged in first current path arrangement positions Y11, Y12, and Y13 and second current path arrangement positions Y21, Y22, and Y23. Magnetic sensors included in the current detectors and arranged in the current path arrangement positions Y11, Y12, Y13, Y21, Y22, and Y23 each detect any one of the current detection values $i_{u1s}$, $i_{v1s}$, $i_{w1s}$, $i_{u2s}$, $i_{v2s}$, and $i_{w2s}$. The current path arrangement positions Y11, Y21, Y12, Y22, Y13, and Y23 are arranged in this order on the same circle in such a way that an arrangement angle of adjacent current path arrangement positions with respect to the rotor axis 100 is π/3. As shown in FIG. 4, in the first current path arrangement position Y11, a first magnetic sensor S11 detects the magnetic field generated from a first current path X11, and i11 is obtained. The figure shows that the power converter 4a or the power converter 4b is positioned on the back side of the paper plane, and the AC rotating machine 1 is connected thereto on the front side of the paper plane, and thus the current flows in a direction from the power converter to the AC rotating machine as a positive current. Although not shown in the figure, similar to the first current path arrangement position Y11, in the first current path arrangement position Y12, the first magnetic sensor S12 detects the magnetic field generated from a first current path X12, and i12 is obtained, and in the first current path arrangement position Y13, the first magnetic sensor S13 detects the magnetic field generated from a first current path X13, and i13 is obtained. Further, in the second current path arrangement position Y21, the second magnetic sensor S21 detects the magnetic field generated from the second current path X21, and i21 is obtained. In the second current path arrangement position Y22, the second magnetic sensor S22 detects the magnetic field generated from the second current path X22, and i22 is obtained. In the second current path arrangement position Y23, the second magnetic sensor S23 detects the magnetic field generated from the second current path X23, and i23 is obtained.

Figure 5:
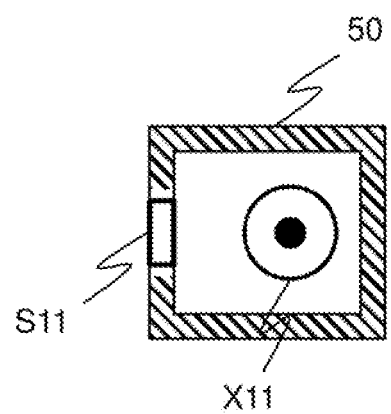
FIG. 5 is a diagram showing another example of a positional relationship between a current path and a magnetic sensor in the current detection apparatus according to the first embodiment.

In FIG. 4, the first current path X11 and the first magnetic sensor S11 are disposed on right and left sides, respectively. For example, as shown in FIG. 5, a configuration may be adopted in which a magnetic field generated by the first current path X11 is collected using a magnetic material 50 and detected by the first magnetic sensor S11. Further, in FIG. 3, the current paths in the first current path arrangement positions and the second current path arrangement positions are arranged in a radial pattern. However, the same effect can be obtained even when the current paths are arranged in a direction such as a front-to-back or back-to-front direction in the paper plane.

The magnetic field generated by the rotor of the AC rotating machine and transmitted through the shaft being the axle of the rotor is a disturbance to the magnetic sensor. However, the current path arrangement positions are set on the same circle whose center is the rotor axis 100 as shown in FIG. 3, so that disturbance magnetic field at each of the magnetic sensors can be made equal. Thus, in-phase noise can be cancelled out on the dq-axis, and thereby the influence on the output torque can be reduced. Note that, it is not a requirement that the center of the circle coincides with the rotor axis 100. For example, if the leak of the magnetic field from the shaft at the positions where magnetic sensors are disposed is small, the influence of the noise caused by the leak of the magnetic field from the shaft is small even if the center of the circle does not coincide with the rotor axis.

In the following description, it will be explained which current path arrangement position is appropriate to arrange each of the current paths for the six phases U1 to W2. In a case where current detection values are normalized assuming that all amplitudes of the currents for all the phases are equal, the current detection values $i_{u1s}$, $i_{v1s}$, $i_{w1s}$, $i_{u2s}$, $i_{v2s}$, and $i_{w2s}$ are given by Formula (1) when an electric angle is θ and a phase angle of a current is β.

$$\begin{pmatrix} i_{u1s} \\ i_{v1s} \\ i_{w1s} \\ i_{u2s} \\ i_{v2s} \\ i_{w2s} \end{pmatrix} = \begin{pmatrix} a_{u1\_u1} & a_{v1\_u1} & a_{w1\_u1} & a_{u2\_u1} & a_{v2\_u1} & a_{w2\_u1} \\ a_{u1\_v1} & a_{v1\_v1} & a_{w1\_v1} & a_{u2\_v1} & a_{v2\_v1} & a_{w2\_v1} \\ a_{u1\_w1} & a_{v1\_w1} & a_{w1\_w1} & a_{u2\_w1} & a_{v2\_w1} & a_{w2\_w1} \\ a_{u1\_u2} & a_{v1\_u2} & a_{w1\_u2} & a_{u2\_u2} & a_{v2\_u2} & a_{w2\_u2} \\ a_{u1\_v2} & a_{v1\_v2} & a_{w1\_v2} & a_{u2\_v2} & a_{v2\_v2} & a_{w2\_v2} \\ a_{u1\_w2} & a_{v1\_w2} & a_{w1\_w2} & a_{u2\_w2} & a_{v2\_w2} & a_{w2\_w2} \end{pmatrix} \times \quad (1)$$

$$\begin{pmatrix} \cos(\theta + \beta) \\ \cos\left(\theta + \beta - \frac{2}{3}\pi\right) \\ \cos\left(\theta + \beta + \frac{2}{3}\pi\right) \\ \cos\left(\theta + \beta - \frac{\pi}{6}\right) \\ \cos\left(\theta + \beta - \frac{5}{6}\pi\right) \\ \cos\left(\theta + \beta + \frac{\pi}{2}\right) \end{pmatrix}$$

Here, $a_{lj\_ki}$ (k, l: u, v, w, and i, j: 1, 2) represents a ratio at which a magnetic sensor disposed to face the current path ki senses the magnetic field due to the current in the current path lj. That is, it is a coupling coefficient. For example, $a_{u1\_u1}$ represents the ratio at which the magnetic sensor disposed to face the current path U1 senses the magnetic field due to the current in the current path U1. That is, it is the coupling coefficient between the magnetic sensor and the current path of the current intended to be detected. Further, $a_{v1\_u1}$ represents the ratio at which the magnetic sensor disposed to face the current path U1 senses the magnetic field due to the current in the current path V1. That is, it is the coupling coefficient between the magnetic sensor disposed to face the current path U1 and the current path V1. In this way, in the coefficient $a_{lj\_ki}$, if ki and lj are the same, the coefficient corresponds to that with regard to the current intended to be detected, and if ki and lj are not the same, the coefficient corresponds to that with regard to a noise component.

The three-phase currents that are detected can be converted into a dq-axis currents on the basis of Formula (2) and Formula (3).

$$\begin{pmatrix} i_{d1} \\ i_{q1} \end{pmatrix} = \sqrt{\frac{2}{3}} \begin{pmatrix} \sin(\theta + \frac{\pi}{2}) & \sin(\theta - \frac{\pi}{6}) & \sin(\theta - \frac{5}{6}\pi) \\ -\sin\theta & -\sin(\theta - \frac{2}{3}\pi) & -\sin(\theta + \frac{2}{3}\pi) \end{pmatrix} \begin{pmatrix} i_{u1s} \\ i_{v1s} \\ i_{w1s} \end{pmatrix} \quad (2)$$

$$\begin{pmatrix} i_{d2} \\ i_{q2} \end{pmatrix} = \sqrt{\frac{2}{3}} \begin{pmatrix} -\sin(\theta - \frac{2}{3}\pi) & -\sin(\theta + \frac{2}{3}\pi) & -\sin\theta \\ -\sin(\theta - \frac{\pi}{6}) & -\sin(\theta - \frac{5}{6}\pi) & -\sin(\theta + \frac{\pi}{2}) \end{pmatrix} \begin{pmatrix} i_{u2s} \\ i_{v2s} \\ i_{w2s} \end{pmatrix} \quad (3)$$

Using the fact that the differential currents ($I_{d1}$-$I_{d2}$ and $I_{q1}$-$I_{q2}$) are substantially small as compared to the sum currents ($I_{d1}$+$I_{d2}$=$I_d$, and $I_{q1}$+$I_{q2}$=$I_q$), an output torque is given by Formula (4). Thus, by decreasing a detection error included in the sum currents, the output torque accuracy can be improved or an output torque ripple can be reduced.

$$T = P_m\{(I_{q1}+I_{q2})\varphi + (L_d-L_q)(I_{d1}I_{q1}+I_{d2}I_{q2})\} \approx P_m\{(I_{q1}+I_{q2})\varphi + \frac{1}{2}(L_d-L_q)(I_{d1}+I_{d2})(I_{q1}+I_{q2})\} \quad (4)$$

Here, Pm is the number of pairs of poles, $\varphi$ is a magnetic flux of the rotor, $L_d$ and $L_q$ are a d-axis inductance and a q-axis inductance, respectively.

A d-axis sum current $I_d$ is expressed by the sum of a DC component $I_{d\_sum\_dc}$ and an AC component $I_{d\_sum\_ac}$, and a q-axis sum current $I_q$ is expressed by the sum of a DC component $I_{q\_sum\_dc}$ and an AC component $I_{q\_sum\_ac}$, and these components are given by respective formulas (5) to (8).

$$I_{d\_sum\_dc} = \quad (5)$$
$$\frac{1}{\sqrt{6}}\{(a_{u1\_u1}+a_{v1\_v1}+a_{w1\_w1}+a_{u2\_u2}+a_{v2\_v2}+a_{w2\_w2})\sin(\beta+\frac{\pi}{2}) +$$
$$(a_{u1\_w2}+a_{v1\_u2}+a_{w1\_v2}-a_{w2\_u1}-a_{u2\_v1}-a_{v2\_w1})\sin\beta +$$
$$(a_{u1\_u2}+a_{v1\_v2}+a_{w1\_w2}-a_{v2\_u1}-a_{w2\_v1}-a_{u2\_w1})$$
$$\sin(\beta+\frac{2}{3}\pi) + (a_{u1\_v2}+a_{v1\_w2}+a_{w1\_u2} -$$
$$a_{u2\_u1}-a_{v2\_v1}-a_{w2\_w1})\sin(\beta+\frac{4}{3}\pi) -$$
$$(a_{u1\_v1}+a_{v1\_w1}+a_{w1\_u1}+a_{u2\_v2}+a_{v2\_w2}+a_{w2\_u2})\sin(\beta+\frac{\pi}{6}) -$$
$$(a_{u1\_w1}+a_{v1\_u1}+a_{w1\_v1}+a_{u2\_w2}+a_{v2\_u2}+a_{w2\_v2})\sin(\beta+\frac{5}{6}\pi)\}$$

$$I_{d\_sum\_ac} = \frac{1}{\sqrt{6}}\{(a_{u1\_u1}-a_{w2\_w2})\sin(2\theta+\beta+\frac{\pi}{2}) + (a_{v1\_v1}-a_{u2\_u2}) \quad (6)$$
$$\sin(2\theta+\beta+\frac{7}{6}\pi) + (a_{w1\_w1}-a_{v2\_v2})\sin(2\theta+\beta+\frac{11}{6}\pi) -$$
$$(a_{u1\_w2}+a_{v1\_v2}+a_{w1\_u2}+a_{w2\_u1}+a_{v2\_v1}+a_{u2\_w1})\sin(2\theta+\beta) -$$
$$(a_{u1\_v2}+a_{v1\_u2}+a_{w1\_w2}+a_{v2\_u1}+a_{u2\_v1}+a_{w2\_w1})$$
$$\sin(2\theta+\beta+\frac{2}{3}\pi) -$$
$$(a_{u1\_u2}+a_{v1\_w2}+a_{w1\_v2}+a_{u2\_u1}+a_{w2\_v1}+a_{v2\_w1})$$
$$\sin(2\theta+\beta+\frac{4}{3}\pi) +$$
$$(a_{v1\_w1}+a_{w1\_v1}-a_{u2\_u2}-a_{v2\_u2})\sin(2\theta+\beta+\frac{\pi}{2}) +$$
$$(a_{w1\_u1}+a_{u1\_w1}-a_{v2\_w2}-a_{w2\_v2})\sin(2\theta+\beta+\frac{7}{6}\pi) +$$
$$(a_{u1\_v1}+a_{v1\_u1}-a_{w2\_u2}-a_{u2\_w2})\sin(2\theta+\beta+\frac{11}{6}\pi)\}$$

$$I_{q\_sum\_dc} = \quad (7)$$
$$\frac{1}{\sqrt{6}}\{(a_{u1\_u1}+a_{v1\_v1}+a_{w1\_w1}+a_{u2\_u2}+a_{v2\_v2}+a_{w2\_w2})\sin\beta -$$
$$(a_{u1\_w2}+a_{v1\_u2}+a_{w1\_v2}-a_{w2\_u1}-a_{u2\_v1}-a_{v2\_w1})\sin(\beta+\frac{\pi}{2}) -$$
$$(a_{u1\_u2}+a_{v1\_v2}+a_{w1\_w2}-a_{v2\_u1}-a_{w2\_v1}-a_{u2\_w1})$$
$$\sin(\beta+\frac{7}{6}\pi) - (a_{u1\_v2}+a_{v1\_w2}+a_{w1\_u2} -$$
$$a_{u2\_u1}-a_{v2\_v1}-a_{w2\_w1})\sin(\beta+\frac{11}{6}\pi) +$$
$$(a_{u1\_v1}+a_{v1\_w1}+a_{w1\_u1}+a_{u2\_v2}+a_{v2\_w2}+a_{w2\_u2})$$
$$\sin(\beta+\frac{2}{3}\pi) +$$
$$(a_{u1\_w1}+a_{w1\_v1}+a_{v1\_u1}+a_{u2\_w2}+a_{w2\_v2}+a_{v2\_u2})\sin(\beta+\frac{4}{3}\pi)\}$$

$$I_{q\_sum\_ac} = \frac{1}{\sqrt{6}} \quad (8)$$
$$\{-(a_{u1\_u1}-a_{w2\_w2})\sin(2\theta+\beta) - (a_{v1\_v1}-a_{u2\_u2})\sin(2\theta+\beta+\frac{2}{3}\pi) -$$
$$(a_{u1\_w2}+a_{v1\_v2}+a_{w1\_u2}+a_{w2\_u1}+a_{v2\_v1}+a_{u2\_w1})$$
$$\sin(2\theta+\beta+\frac{\pi}{2}) -$$
$$(a_{u1\_v2}+a_{v1\_u2}+a_{w1\_w2}+a_{v2\_u1}+a_{u2\_v1}+a_{w2\_w1})$$
$$\sin(2\theta+\beta+\frac{7}{6}\pi) -$$
$$(a_{u1\_u2}+a_{v1\_w2}+a_{w1\_v2}+a_{u2\_u1}+a_{w2\_v1}+a_{v2\_w1})$$
$$\sin(2\theta+\beta+\frac{11}{6}\pi) -$$
$$(a_{v1\_w1}+a_{w1\_v1}-a_{u2\_v2}-a_{v2\_u2})\sin(2\theta+\beta) -$$
$$(a_{w1\_u1}+a_{u1\_w1}-a_{v2\_w2}-a_{w2\_v2})\sin(2\theta+\beta+\frac{2}{3}\pi) -$$
$$(a_{u1\_v1}+a_{v1\_u1}-a_{w2\_u2}-a_{u2\_w2})\sin(2\theta+\beta+\frac{4}{3}\pi)\}$$

In each formula, when apart expressed by a sine function with the same phase is regarded as a term, terms from the second to the sixth in Formulas (5) and (7) correspond to error components. In the second term to the fourth term, their phases are different by ($2/3$)π in order. If the amplitude of the sine function in each term is equal, the sum from the second term to the fourth term is zero (Condition (B) described later: terms from the second term to the fourth term are cancelled out). That is, in order to make the error components zero in Formulas (5) and (7), the amplitudes from the second term to the fourth term need to be equal, and the amplitudes of the fifth term and the sixth term need to be zero (Condition (A) described later: an amplitude of a term corresponding to an error component becomes zero by coefficients being cancelled out). In Formulas (6) and (8), terms from the first to the ninth correspond to error components. In the first term to the third term, their phases are different by ($2/3$)π in order. If the amplitude of each term is equal, the sum from the first term to the third term is zero (Condition (B) described later). In the fourth term to the sixth term, their phases are different by ($2/3$)π in order. If the amplitude of each term is equal, the sum from the fourth term to the sixth term is zero (Condition (B) described later). In the seventh term to the ninth term, their phases are different by ($2/3$)π in order. If the amplitude of each term is equal, the sum from the seventh term to the ninth term is zero (Condition (B) described later). That is, in order to make the error components zero in Formula (6) and Formula (8), the requirement is that the amplitudes from the first term to the third term are equal, the amplitudes from the fourth term to the sixth term are equal, and the amplitudes from the seventh term to the ninth term is equal.

As described above, by normalizing current detection values on the assumption that n is a multiple of three and all amplitudes of the currents for all the phases are equal, the d-axis sum current and the q-axis sum current based on the dq-transformed current can be represented collectively with each of terms of sine functions with different phases to one another by putting together terms expressed by sine functions with the same phase. In the case of a 2n-phase AC rotating machine (for example, n equals three) in which two sets of three-phase windings whose phase difference is π/6 as shown in FIG. 2 are included, the d-axis sum current and the q-axis sum current can be represented by Formulas (5) to (8). Using cancellation among the coefficients $a_{l\_k}$ (l≠k) that have effective values within a term of sine function with the same phase or cancellation among values of terms of sine functions with different phases, and in such a manner that error terms in the dq-transformed current satisfy at least one of the following conditions (A) and (B), each of 2n current paths where each of magnetic sensors is disposed to face each of the current paths is assigned to each of 2n current path arrangement positions. Thus a current detection apparatus with a small detection error can be obtained. That is, since it is not necessary to dispose each magnetic sensor far away from other phases, a current detection apparatus with a small error that does not require much space and additional members such as a correction conductor or a magnetic shield can be obtained.

(A) At least in a term, an amplitude of the term corresponding to an error component is reduced by coefficients being cancelled out, the coefficients contained in the term.

(B) Error components are reduced by cancellation among values of terms of sine functions with different phases.

Figures 6, 7:
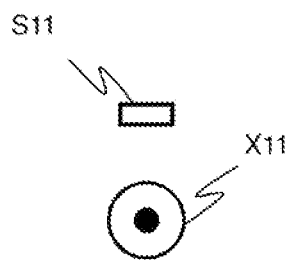
FIG. 6 is a diagram showing a table for explaining assignment of current path arrangement in the current detection apparatus according to the first embodiment.
FIG. 7 is a diagram showing still another example of a positional relationship between a current path and a magnetic sensor in the current detection apparatus according to the first embodiment.

Hereinafter, an arrangement of a current detector that satisfies any one of the conditions (A) and (B) will be described. That is, a specific arrangement of a current path of each phase will be described. As shown in FIG. 6, six combinations in which current phases are assigned to the first current paths X11 to X13 and the second current paths X21 to X23 are considered. When V1 phase is to be assigned to X11, U, V, and W need to be replaced by V, W, and U in FIG. 6, respectively. When W1 phase is to be assigned to X11, U, V, and W need to be replaced by W, U and V in FIG. 6, respectively.

In the following description, the coefficients in Formula (1) are normalized as shown in Formula (9).

$$a_{u1\_u1} = a_{v1\_v1} = a_{w1\_w1} = a_{u2\_u2} = a_{v2\_v2} = a_{w2\_w2} = 1 \quad (9)$$

In the case of the combination C1 in FIG. 6, other coefficients are given by Formula (10). Since the coefficient values in Formula (5) are $-6k_1$ for the second term, $3k_1$ for the third and fourth terms, $-6k_2$ for the fifth term, and $6k_2$ for the sixth term, an error of the DC component of the sum current remains. In contrast, for example, the sum of the coefficients of the fourth term in Formula (6) is $-k_1+0+k_1+k_1+0-k_1$, and thereby the amplitude becomes zero. In this way, all of the amplitudes from the first term to the ninth term in Formula (6) become zero by the cancellation among coefficients in each term, so that an error of the AC component of the sum current can be reduced. That is, the error terms of the AC component satisfy the condition (A).

$$\begin{cases} a_{u1\_v2} = a_{v2\_w1} = a_{w1\_u2} = a_{u2\_v1} = a_{v1\_w2} = a_{w2\_u1} = k_1 \\ a_{u1\_w1} = a_{v2\_u2} = a_{w1\_v1} = a_{u2\_w2} = a_{v1\_u1} = a_{w2\_v2} = k_2 \\ a_{u1\_u2} = a_{v2\_v1} = a_{w1\_w2} = a_{u2\_u1} = a_{v1\_v2} = a_{w2\_w1} \approx 0 \\ a_{u1\_v1} = a_{v2\_w2} = a_{w1\_u1} = a_{u2\_v2} = a_{v1\_w1} = a_{w2\_u2} = -k_2 \\ a_{u1\_w2} = a_{v2\_u1} = a_{w1\_v2} = a_{u2\_w1} = a_{v1\_u2} = a_{w2\_v1} = -k_1 \end{cases} \quad (10)$$

In the case of the combination C2 in FIG. 6, other coefficients are given by Formula (11). All of the amplitudes from the second term to the sixth term in Formula (5) and from the first term to the ninth term in Formula (6) become zero, so that both of the errors of the DC and AC components in the sum currents can be reduced. That is, the error terms of the DC and AC components satisfy the condition (A).

$$\begin{cases} a_{u1\_u2} = a_{u2\_w1} = a_{w1\_v2} = a_{v2\_v1} = a_{v1\_w2} = a_{w2\_u1} = k_1 \\ a_{u1\_w1} = a_{v2\_u2} = a_{w1\_v1} = a_{v2\_w2} = a_{v1\_u1} = a_{w2\_u2} = k_2 \\ a_{u1\_v2} = a_{u2\_v1} = a_{w1\_w2} = a_{v2\_u1} = a_{v1\_u2} = a_{w2\_w1} \approx 0 \\ a_{u1\_v1} = a_{u2\_w2} = a_{w1\_u1} = a_{v2\_u2} = a_{v1\_w1} = a_{w2\_v2} = -k_2 \\ a_{u1\_w2} = a_{u2\_u1} = a_{w1\_u2} = a_{v2\_w1} = a_{v1\_v2} = a_{w2\_v1} = -k_1 \end{cases} \quad (11)$$

Similarly, in the combinations C1, C3, and C5 in FIG. 6, although the error of the DC component in the sum current remains, the error of the AC component in the sum current can be reduced. That is, the error terms of the AC component satisfy the condition (A). In the combinations C1, C3, and C5 in FIG. 6, phases of currents flowing in the first current paths X11 to X13 are advanced by 2π/3 in this order, and phases of currents flowing in the second current paths X21 to X23 are advanced by 2π/3 in this order. The same is applicable to an AC rotating machine including two sets of n-phase windings where n is a multiple of three. The current paths are arranged in such a manner that the phases of current flowing in n current paths arranged in the first current path arrangement positions, that is, one set of n current path arrangement positions, are advanced by 2π/n rad in order in the circular direction with respect to the circle where the current path arrangement positions are set, and also the phases of current flowing in n current paths arranged in the second current path arrangement positions, that is, the other one set of n current path arrangement positions, are advanced by 2π/n rad in order in the same circular direction, thereby bringing about a new advantageous effect in that the output torque ripple can be reduced. Note that, with reference to FIG. 3 and FIG. 6, the circular direction described above is clockwise. For example, even in the case of the circular direction being anticlockwise where the positions Y13, Y11, Y23, Y21 are exchanged with those of Y11, Y13, Y21, and Y23 in FIG. 3, respectively, the same description above is exactly applicable. That is, it goes without saying that the above-mentioned circular direction may be any one of those being clockwise and counterclockwise. The same applies to the following descriptions.

Further, in the combinations C2, C4, and C6 in FIG. 6, both of the errors of the DC and AC components in the sum currents can be reduced. That is, the error terms of the DC and AC components satisfy the condition (A). In the combinations C2, C4, and C6 in FIG. 6, phases of the currents flowing in the first current paths X11 to X13 are advanced by 2π/3 in this order, and phases of the currents flowing in the second current paths X21 to X23 are delayed by 2π/3 in this order. The same is applicable to an AC rotating machine including two sets of n-phase windings where n is a multiple of three. The current paths are arranged in such a manner that the phases of current flowing in n current paths arranged in one set of n current path arrangement positions are advanced by 2π/n rad in order in the circular direction with respect to the circle where the current path arrangement positions are set, and also the phases of current flowing in n current paths arranged in the other one set of n current path arrangement positions are delayed by 2π/n rad in order in the same circular direction, thereby bringing about a new advantageous effect in that accuracy of the output torque can be improved and the output torque ripple can also be reduced.

For example, in the case where the current detection apparatus according to the present embodiment is used for a controlled object such as a generator motor for a vehicle where accuracy of the output torque is required, one of the combinations C2, C4, or C6 may be selected. In the case where the current detection apparatus according to the present embodiment is used for a controlled object such as a rotating machine for an electric power steering system where the output torque ripple needs to be reduced, any one of the combinations C1 to C6 may be selected.

Figure 8:
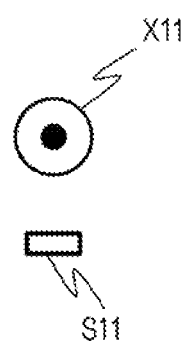
FIG. 8 is a diagram showing still another example of a positional relationship between a current path and a magnetic sensor in the current detection apparatus according to the first embodiment.
Figure 9:
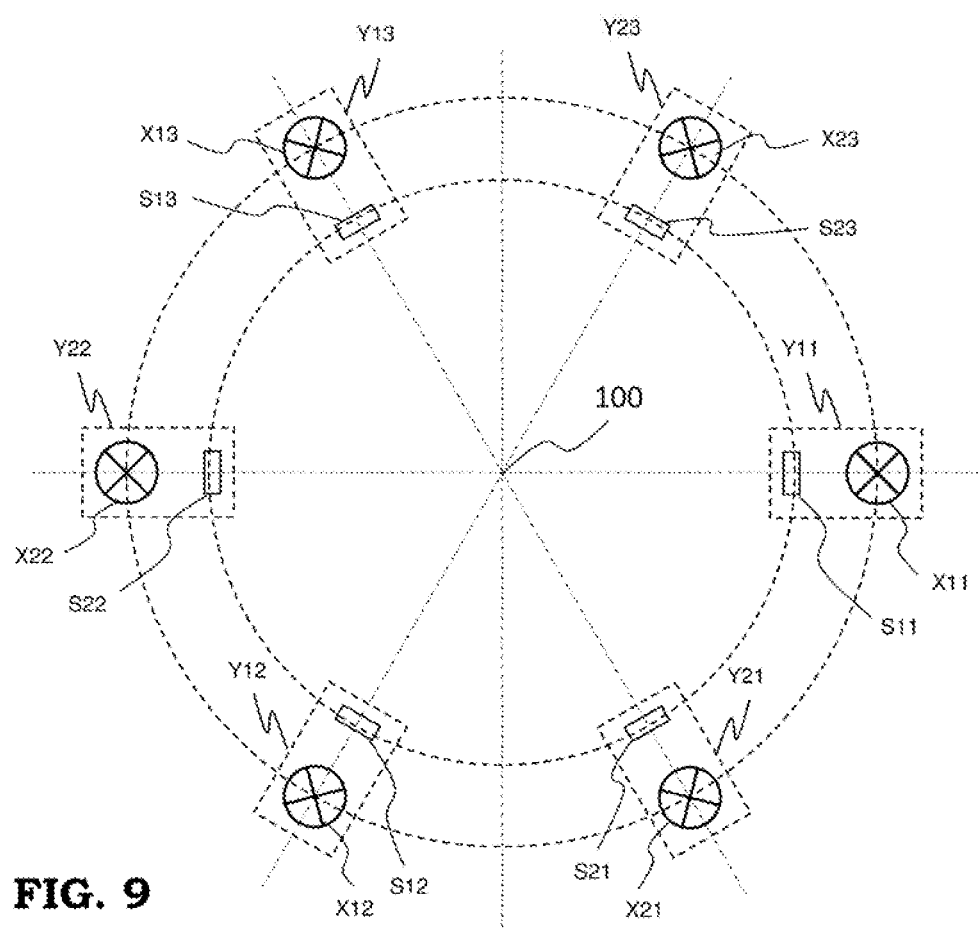
FIG. 9 is a diagram showing an example of a positional arrangement at each of the current path arrangement positions regarding current paths and magnetic sensors in the current detection apparatus according to the first embodiment.

In order to make the amplitudes in the error terms of the DC and AC components zero by the cancellation among coefficients, the relation where $a_{u1\_u2}$ equals $-a_{2u\_u1}$ is used. Thus, the arrangement preferably needs to be made in such a way that magnitude of the magnetic field generated by the second current path X21 at the first magnetic sensor S11 in the direction of its detection axis equals the magnitude of the magnetic field generated by the first current path X11 at the second magnetic sensor S21 in the direction of its detection axis. In the case where the current paths, as shown in FIG. 3, are arranged in a radial pattern at the current path arrangement positions in the same plane, the arrangement described above can be implemented by disposing the magnetic sensor on the upper side of the current path (on the front side of paper plane) as shown in FIG. 7 or on the lower side of the current path (on the back side of paper plane) as shown in FIG. 8. That is, the distance between the plane on which the first magnetic sensor is disposed and the plane on which the first current path is arranged is made equal to the distance between the plane on which the second magnetic sensor is disposed and the plane on which the second current path is arranged, and thereby the influence from the interfering magnetic field can be made equivalent. Furthermore, in the case where the current paths are arranged perpendicular to the paper plane as shown in FIG. 9, the magnetic sensors may be disposed on a concentric circle with respect to the circle of the current path arrangement. In FIG. 9, although the magnetic sensors are disposed on the inner radial side to the current paths, the alternative may be on the outer radial side to the current paths. The circle on which the first current paths and the second current paths are arranged and the circle on which the first magnetic sensors and the second magnetic sensors are disposed are made concentric, so that the influence from the interfering magnetic field can be made equivalent.

Figure 10:
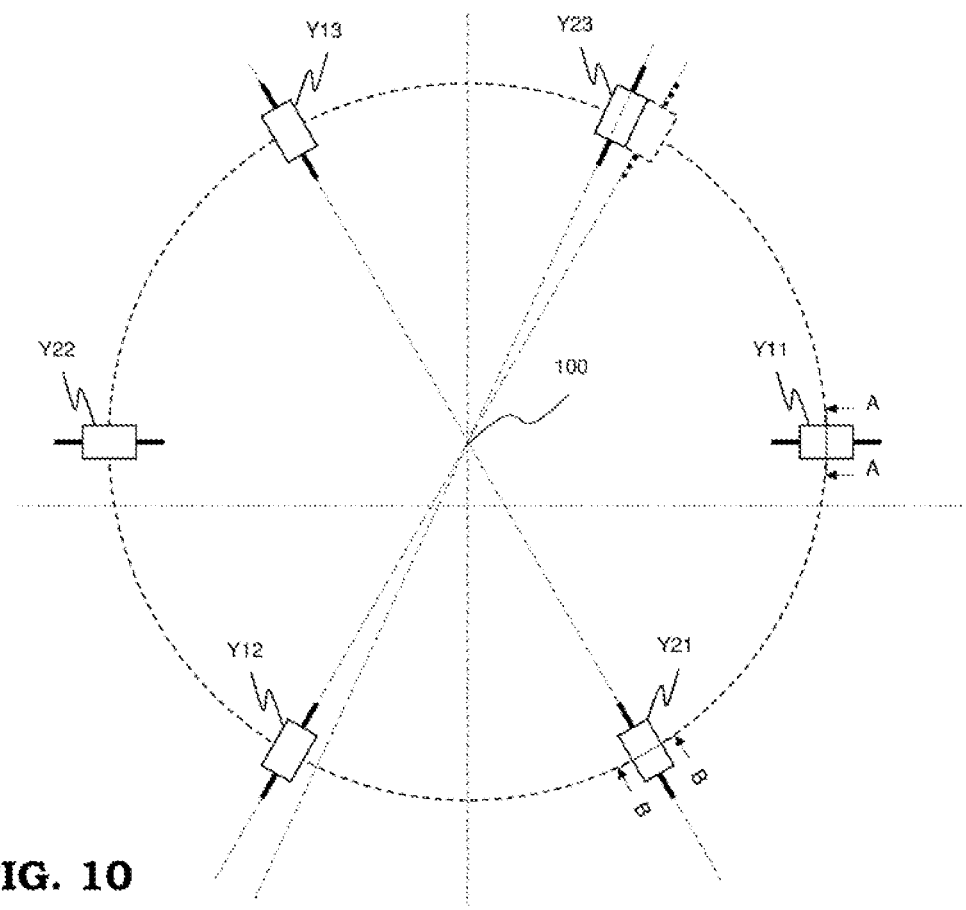
FIG. 10 is a diagram showing a case in which a part of the current path arrangement positions in the current detection apparatus is deviated, according to the first embodiment.

An influence on the detection performance when a part of the current path arrangement positions are deviated from the positions shown in FIG. 3 will be described using FIG. 10. Referring to FIG. 3, only the position Y23 is deviated in FIG. 10. In the current path arrangement shown in FIG. 3 and in the combination C2 shown in FIG. 6, each of the amplitudes of the terms in Formulas (5) to (8) becomes zero on the basis of Formula (11), so that the errors of the DC and AC components in the sum currents can be made zero. In the case of FIG. 10, for example, compared with the case in which the position Y23 is not deviated, the distance between the U1-phase and the U2-phase becomes longer, and the distance between the W1-phase and the U2-phase becomes shorter. Thus, $a_{u1\_u2}$ becomes smaller and $a_{u2\_w1}$ becomes larger as compared with the case in which the position Y23 is not deviated. As a result, each of the coefficients is given by Formulas (12) and (13) and about 0.6% error in the DC component of the sum current is produced. Maximum values in the Formulas (12) and (13) are 0.12 in $a_{u2\_w1}$ and $a_{w1\_u2}$. Despite the maximum 12% detection error in the phase arrangement, the detection error can be reduced by the proper arrangement. Thus, the same advantageous effect can be obtained when the positional deviation is such that the error falls within the upper limit of the error in the output torque, even in the case with the positional deviation.

$$\begin{cases} a_{w1\_v2} = a_{v2\_v1} = a_{v1\_w2} = a_{w2\_u1} = 0.1 \\ a_{u1\_w2} = a_{w1\_v1} = a_{v2\_w2} = a_{v1\_u1} = 0.05 \\ a_{u1\_v2} = a_{w1\_w2} = a_{v2\_u1} = a_{w2\_w1} = 0 \\ a_{u1\_v1} = a_{w1\_u1} = a_{v1\_w1} = a_{w2\_v2} = -0.05 \\ a_{u1\_w2} = a_{v2\_w1} = a_{v1\_v2} = a_{w2\_v1} = -0.1 \end{cases} \quad (12)$$

$$\begin{cases} a_{u1\_u2} = 0.08 & a_{u2\_w1} = 0.12 \\ a_{u2\_v2} = 0.06 & a_{w2\_u2} = 0.04 \\ a_{u2\_v1} = 0.001 & a_{v1\_u2} = -0.001 \\ a_{v2\_u2} = -0.06 & a_{u2\_w2} = -0.04 \\ a_{u2\_u1} = -0.08 & a_{w1\_u2} = -0.12 \end{cases} \quad (13)$$

Figure 11:
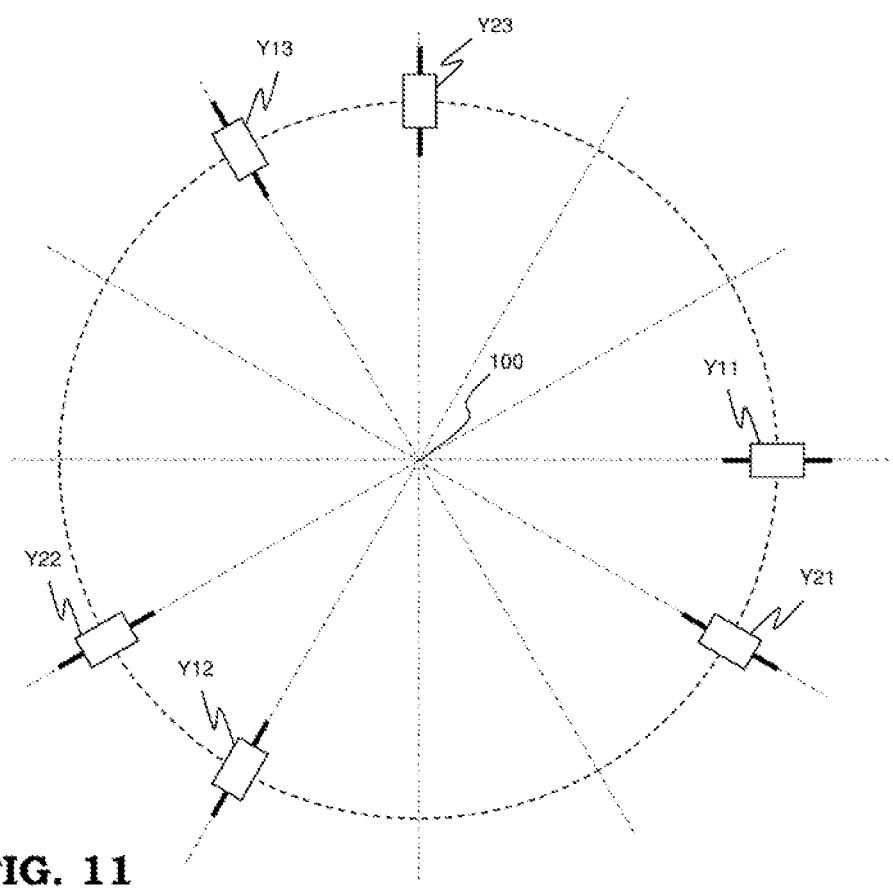
FIG. 11 is a diagram showing another example of the current path arrangement positions in the current detection apparatus according to the first embodiment.

The first current path arrangement positions and the second current path arrangement positions are alternately arranged at equal intervals on the circle in FIG. 3. In contrast, as shown in FIG. 11, the first current path arrangement positions themselves may be arranged at equal intervals and the second current path arrangement positions themselves may be arranged at equal intervals. However, the first current path arrangement positions and the second current path arrangement positions may be alternately arranged at non-equal intervals. Two combinations shown in FIG. 12 in which current phases are assigned to the first current paths X11 to X13 and the second current paths X21 to X23 are considered. In the case of the combination C1 in FIG. 12, other coefficients are given by Formula (14). The error of the DC component in the sum current remains, but the error of the AC components can be reduced. That is, the error terms of the AC component satisfy the condition (A). In the combination C1 in FIG. 12, phases of the currents flowing in the first current paths X11 to X13 are advanced by 2π/3 in this order, and phases of the currents flowing in the second current paths X21 to X23 are also advanced by 2π/3 in this order. The same is applicable to an AC rotating machine including two sets of n-phase windings where n is a multiple of three. The current paths are arranged in such a manner that the phases of current flowing in n current paths arranged in one set of n current path arrangement positions are advanced by 2π/n rad in order in the circular direction with respect to the circle where the current path arrangement positions are set, and also the phases of current flowing in n current paths arranged in the other one set of n current path arrangement positions are advanced by 2π/n rad in order in the same circular direction, thereby bringing about a new advantageous effect in that the output torque ripple can be reduced.

$$\begin{cases} a_{u2\_u1} = k_1 & a_{v1\_u1} = k_2 & a_{v2\_u1} = k_3 & a_{w1\_u1} = -k_2 & a_{w2\_u1} = k_4 \\ a_{u1\_u2} = -k_1 & a_{v1\_u2} = -k_4 & a_{v2\_u2} = k_2 & a_{w1\_u2} = -k_3 & a_{w2\_u2} = -k_2 \\ a_{u1\_v1} = -k_2 & a_{u2\_v1} = k_4 & a_{v2\_v1} = k_1 & a_{w1\_v1} = k_2 & a_{w2\_v1} = k_3 \\ a_{u1\_v2} = -k_3 & a_{u2\_v2} = -k_2 & a_{v1\_v2} = -k_1 & a_{w1\_v2} = -k_4 & a_{w2\_v2} = k_2 \\ a_{u1\_w1} = k_2 & a_{u2\_w1} = k_3 & a_{v1\_w1} = -k_2 & a_{v2\_w1} = k_4 & a_{w2\_w1} = k_1 \\ a_{u1\_w2} = -k_4 & a_{u2\_w2} = k_2 & a_{v1\_w2} = -k_3 & a_{v2\_w2} = -k_2 & a_{w1\_w2} = -k_1 \end{cases} \quad (14)$$

In the case of the combination C2 in FIG. 12, other coefficients are given by Formula (15). Both of the errors of the DC and AC components in the sum currents can be reduced. That is, terms from the second to the fourth satisfy the condition (B) and the terms from the fifth to the sixth satisfy the condition (A) in the error of the DC component. In addition, the error terms of the AC component satisfy the condition (A). In the combination C2 in FIG. 12, phases of the currents flowing in the first current paths X11 to X13 are advanced by $2\pi/3$ in this order, and phases of the currents flowing in the second current paths X21 to X23 are delayed by $2\pi/3$ in this order. The same is applicable to an AC rotating machine including two sets of n-phase windings where n is a multiple of three. The current paths are arranged in such a manner that the phases of current flowing in n current paths arranged in one set of n current path arrangement positions are advanced by $2\pi/n$ rad in order in the circular direction with respect to the circle where the current path arrangement positions are set, and also the phases of current flowing in n current paths arranged in the other one set of n current path arrangement positions are delayed by $2\pi/n$ rad in order in the same circular direction, thereby bringing about a new advantageous effect in that accuracy of the output torque can be improved and the output torque ripple can also be reduced.

$$\begin{cases} a_{w2\_u1} = k_1 & a_{v1\_u1} = k_2 & a_{v2\_u1} = k_3 & a_{w1\_u1} = -k_2 & a_{u2\_u1} = k_4 \\ a_{u1\_w2} = -k_1 & a_{v1\_w2} = -k_4 & a_{v2\_w2} = k_2 & a_{w1\_w2} = -k_3 & a_{u2\_w2} = -k_2 \\ a_{u1\_v1} = -k_2 & a_{w2\_v1} = k_4 & a_{v2\_v1} = k_1 & a_{w1\_v1} = k_2 & a_{u2\_v1} = k_3 \\ a_{u1\_v2} = -k_3 & a_{w2\_v2} = -k_2 & a_{v1\_v2} = -k_1 & a_{w1\_v2} = -k_4 & a_{u2\_v2} = k_2 \\ a_{u1\_w1} = k_2 & a_{w2\_w1} = k_3 & a_{v1\_w1} = -k_2 & a_{v2\_w1} = k_4 & a_{u2\_w1} = k_1 \\ a_{u1\_u2} = -k_4 & a_{w2\_u2} = k_2 & a_{v1\_u2} = -k_3 & a_{v2\_u2} = -k_2 & a_{w1\_u2} = -k_1 \end{cases} \quad (14)$$

Figure 13:
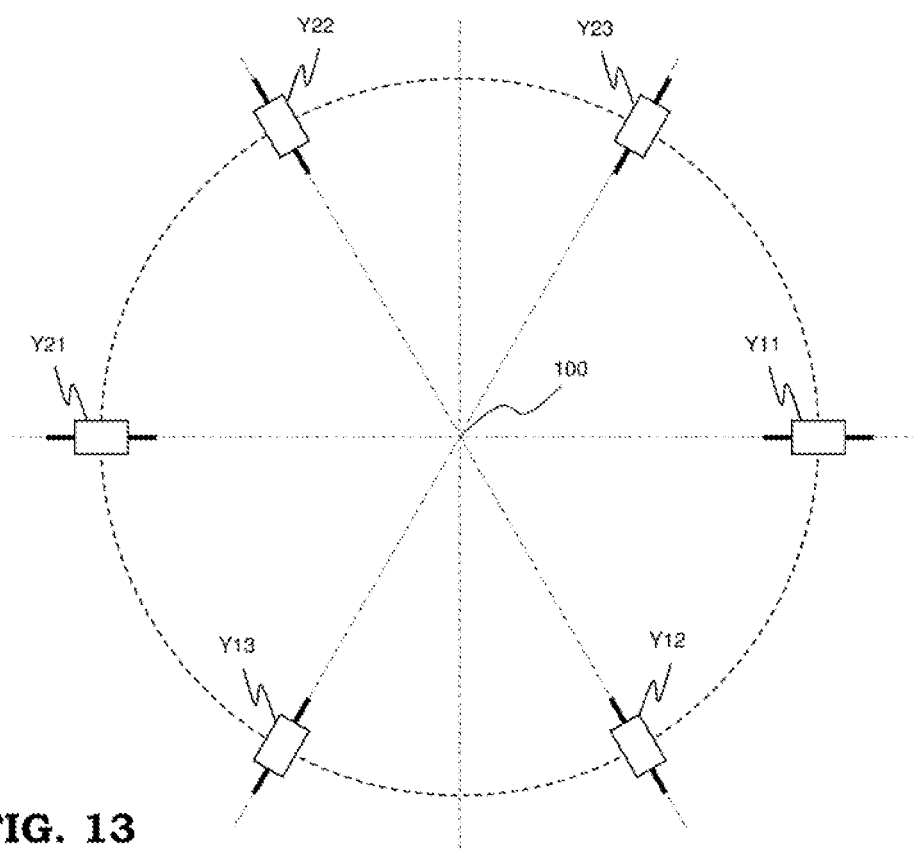
FIG. 13 is a diagram showing still another example of the current path arrangement positions in the current detection apparatus according to the first embodiment.

As shown in FIG. 13, the first current path arrangement positions and the second current path arrangement positions may be arranged separately into two ranges of $\pi$ rad in the circumferential direction, and the first and second current path positions may include respective three current path arrangement positions disposed at equal intervals. Two combinations shown in FIG. 14 in which current phases are assigned to the first current paths X11 to X13 and the second current paths X21 to X23 are considered. In the case of the combination C1 in FIG. 14, other coefficients are given by Formula (16). The error of the DC component in the sum current remains, but the error of the AC components can be reduced. That is, the error terms of the AC component satisfy the condition (A). In the combination C1 in FIG. 14, phases of the currents flowing in the first current paths X11 to X13 are advanced by $2\pi/3$ in this order, and phases of the currents flowing in the second current paths X21 to X23 are also advanced by $2\pi/3$ in this order. The same is applicable to an AC rotating machine including two sets of n-phase windings where n is a multiple of three. The current paths are arranged in such a manner that the phases of current flowing in n current paths arranged in one set of n current path arrangement positions are advanced by $2\pi/n$ rad in order in the circular direction with respect to the circle where the current path arrangement positions are set, and also the phases of current flowing in n current paths arranged in the other one set of n current path arrangement positions are advanced by $2\pi/n$ rad in order in the same circular direction, thereby bringing about a new advantageous effect in that the output torque ripple can be reduced.

$$\begin{cases} a_{u1\_v1} = a_{v1\_w1} = a_{w1\_u2} = a_{u2\_v2} = a_{v2\_w2} = a_{w2\_u1} = k_1 \\ a_{u1\_w1} = a_{v1\_u2} = a_{w1\_v2} = a_{u2\_w2} = a_{v2\_u1} = a_{w2\_v1} = k_2 \\ a_{u1\_u2} = a_{v1\_v2} = a_{w1\_w2} = a_{u2\_u1} = a_{v2\_v1} = a_{w2\_w1} \approx 0 \\ a_{u1\_v2} = a_{v1\_w2} = a_{w1\_u1} = a_{u2\_v1} = a_{v2\_w1} = a_{w2\_u2} = -k_2 \\ a_{u1\_w2} = a_{v1\_u1} = a_{w1\_v1} = a_{u2\_w1} = a_{v2\_u2} = a_{w2\_v2} = -k_1 \end{cases} \quad (16)$$

Figures 14, 15:
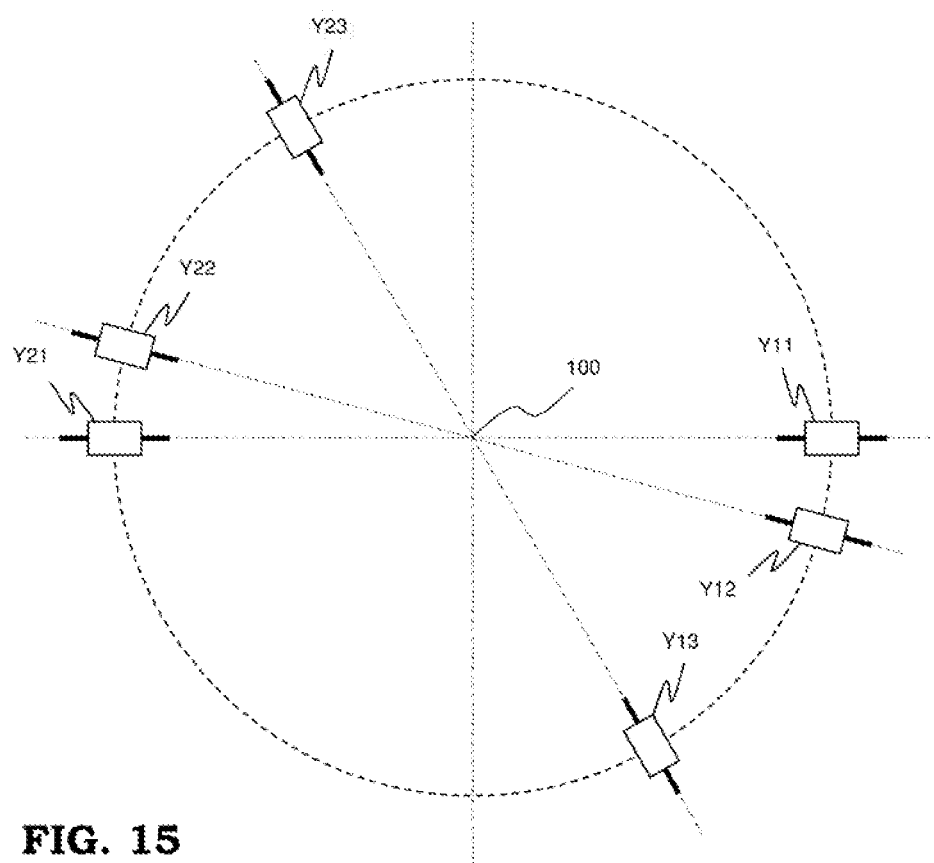
FIG. 14 is a diagram showing a table for explaining still another assignment of current path arrangement in the current detection apparatus according to the first embodiment.
FIG. 15 is a diagram showing still another example of the current path arrangement positions in the current detection apparatus according to the first embodiment.

In the case of the combination C2 in FIG. 14, other coefficients are given by Formula (17). Both of the errors of the DC and AC components in the sum currents can be reduced. That is, the error terms of the DC and AC components satisfy the condition (A). In the combination C2 in FIG. 14, phases of the currents flowing in the first current paths X11 to X13 are advanced by $2\pi/3$ in this order, and phases of the currents flowing in the second current paths X21 to X23 are delayed by $2\pi/3$ in this order. The same is applicable to an AC rotating machine including two sets of n-phase windings where n is a multiple of three. The current paths are arranged in such a manner that the phases of current flowing in n current paths arranged in one set of n current path arrangement positions are advanced by $2\pi/n$ rad in order in the circular direction with respect to the circle where the current path arrangement positions are set, and also the phases of current flowing in n current paths arranged in the other one set of n current path arrangement positions are delayed by $2\pi/n$ rad in order in the same circular direction, thereby bringing about a new advantageous effect in that accuracy of the output torque can be improved and the output torque ripple can also be reduced.

$$\begin{cases} a_{u1\_v1} = a_{v1\_w1} = a_{w1\_w2} = a_{w2\_v2} = a_{v2\_u2} = a_{u2\_u1} = k_1 \\ a_{u1\_w1} = a_{v1\_w2} = a_{w1\_v2} = a_{w2\_w2} = a_{v2\_u1} = a_{u2\_v1} = k_2 \\ a_{u1\_w2} = a_{v1\_v2} = a_{w1\_u2} = a_{w2\_u1} = a_{v2\_v1} = a_{u2\_w1} \approx 0 \\ a_{u1\_v2} = a_{v1\_u2} = a_{w1\_u1} = a_{w2\_v1} = a_{v2\_w1} = a_{u2\_w2} = -k_2 \\ a_{u1\_u2} = a_{v1\_u1} = a_{w1\_v1} = a_{w2\_w1} = a_{v2\_w2} = a_{u2\_v2} = -k_1 \end{cases} \quad (17)$$

Further, as shown in FIG. 15, the first current path arrangement positions and the second current path arrangement positions may be arranged point-symmetrically. Compared with the distances between the first current path arrangement positions or between the second current arrangement positions, the distance between the first current path arrangement positions and the second current arrangement positions are relatively larger, so that the coefficients are approximated by Formula (18).

$$\begin{cases} a_{u1\_u2} \approx a_{u1\_v2} \approx a_{u1\_w2} \approx a_{u2\_u1} \approx a_{u2\_v1} \approx a_{u2\_w1} \approx 0 \\ a_{v1\_v2} \approx a_{v1\_u2} \approx a_{v1\_w2} \approx a_{v2\_u1} \approx a_{v2\_v1} \approx a_{v2\_w1} \approx 0 \\ a_{w1\_u2} \approx a_{w1\_v2} \approx a_{w1\_w2} \approx a_{w2\_u1} \approx a_{w2\_v1} \approx a_{w2\_w1} \approx 0 \end{cases} \quad (18)$$

In the case of the combination C1 in FIG. 14, other coefficients are given by Formula (19). The error of the DC component in the sum current remains, but the error of the AC components can be reduced. That is, the error terms of the AC component satisfy the condition (A). In the case of the combination C2 in FIG. 14, other coefficients are given by Formula (20). Both of the errors of the DC and AC components in the sum currents can be reduced. That is, the error terms of the DC and AC components satisfy the condition (A). The same is applicable to an AC rotating machine including two sets of n-phase windings where n is a multiple of three. The current paths are arranged in such a manner that the phases of current flowing in n current paths arranged in one set of n current path arrangement positions are advanced by $2\pi/n$ rad in order in the circular direction with respect to the circle where the current path arrangement positions are set, and also the phases of current flowing in n current paths arranged in the other one set of n current path arrangement positions are advanced by $2\pi/n$ rad in order in the same circular direction, thereby bringing about a new advantageous effect in that the output torque ripple can be reduced. Furthermore, the current paths are arranged in such a manner that the phases of current flowing in n current paths arranged in one set of n current path arrangement positions are advanced by $2\pi/n$ rad in order in the circular direction with respect to the circle where the current path arrangement positions are set, and also the phases of current flowing in n current paths arranged in the other one set of n current path arrangement positions are delayed by $2\pi/n$ rad in order in the same circular direction, thereby bringing about a new advantageous effect in that accuracy of the output torque can be improved and the output torque ripple can also be reduced.

$$\begin{cases} a_{u1\_v1} = a_{u2\_v2} = k_1 \\ a_{v1\_w1} = a_{v2\_w2} = k_2 \\ a_{w1\_u1} = a_{w2\_u2} = k_3 \\ a_{v1\_u1} = a_{v2\_u2} = -k_1 \\ a_{w1\_v1} = a_{w2\_v2} = -k_2 \\ a_{u1\_w1} = a_{u2\_w2} = -k_3 \end{cases} \quad (19)$$

-continued $$\begin{cases} a_{u1\_v1} = a_{w2\_v2} = k_1 \\ a_{v1\_w1} = a_{v2\_u2} = k_2 \\ a_{w1\_u1} = a_{u2\_w2} = k_3 \\ a_{v1\_u1} = a_{v2\_w2} = -k_1 \\ a_{w1\_v1} = a_{u2\_v2} = -k_2 \\ a_{u1\_w1} = a_{w2\_u2} = -k_3 \end{cases} \quad (20)$$

Figure 16:
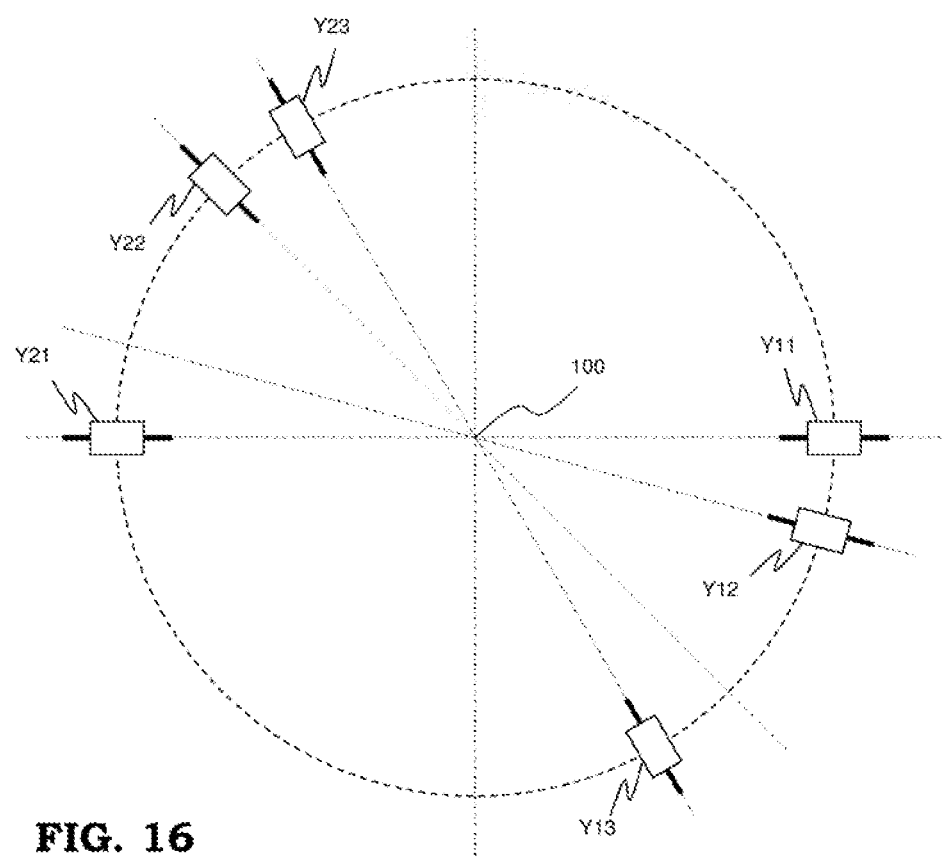
FIG. 16 is a diagram showing still another example of the current path arrangement positions in the current detection apparatus according to the first embodiment.

Further, as shown in FIG. 16, the first current path arrangement positions and the second current path arrangement positions may be arranged line-symmetrically. Compared with the distances between the first current path arrangement positions or between the second current arrangement positions, the distance between the first current path arrangement positions and the second current arrangement positions are relatively larger, so that the coefficients are approximated by Formula (21).

$$\begin{cases} a_{u1\_u2} \approx a_{u1\_v2} \approx a_{u1\_w2} \approx a_{u2\_u1} \approx a_{u2\_v1} \approx a_{u2\_w1} \approx 0 \\ a_{v1\_v2} \approx a_{v1\_u2} \approx a_{v1\_w2} \approx a_{v2\_u1} \approx a_{v2\_v1} \approx a_{v2\_w1} \approx 0 \\ a_{w1\_u2} \approx a_{w1\_v2} \approx a_{w1\_w2} \approx a_{w2\_u1} \approx a_{w2\_v1} \approx a_{w2\_w1} \approx 0 \end{cases} \quad (21)$$

In the case of the combination C1 in FIG. 14, other coefficients are given by Formula (22). The error of the DC component in the sum current remains, but the error of the AC components can be reduced. That is, the error terms of the AC component satisfy the condition (A). In the case of the combination C2 in FIG. 14, other coefficients are given by Formula (23). Both of the errors of the DC and AC components in the sum currents can be reduced. That is, the error terms of the DC and AC components satisfy the condition (A). The same is applicable to an AC rotating machine including two sets of n-phase windings where n is a multiple of three. The current paths are arranged in such a manner that the phases of current flowing in n current paths arranged in one set of n current path arrangement positions are advanced by $2\pi/n$ rad in order in the circular direction with respect to the circle where the current path arrangement positions are set, and also the phases of current flowing in n current paths arranged in the other one set of n current path arrangement positions are advanced by $2\pi/n$ rad in order in the same circular direction, thereby bringing about a new advantageous effect in that the output torque ripple can be reduced. Furthermore, the current paths are arranged in such a manner that the phases of current flowing in n current paths arranged in one set of n current path arrangement positions are advanced by $2\pi/n$ rad in order in the circular direction with respect to the circle where the current path arrangement positions are set, and also the phases of current flowing in n current paths arranged in the other one set of n current path arrangement positions are delayed by $2\pi/n$ rad in order in the same circular direction, thereby bringing about a new advantageous effect in that accuracy of the output torque can be improved and the output torque ripple can also be reduced.

$$\begin{cases} a_{u1\_v1} = a_{v2\_w2} = k_1 \\ a_{v1\_w1} = a_{u2\_v2} = k_2 \\ a_{w1\_u1} = a_{w2\_u2} = k_3 \\ a_{v1\_u1} = a_{w2\_v2} = -k_1 \\ a_{w1\_v1} = a_{v2\_u2} = -k_2 \\ a_{u1\_w1} = a_{u2\_w2} = -k_3 \end{cases} \quad (22)$$

-continued $$\begin{cases} a_{u1\_v1} = a_{v2\_u2} = k_1 \\ a_{v1\_w1} = a_{w2\_v2} = k_2 \\ a_{w1\_u1} = a_{u2\_w2} = k_3 \\ a_{v1\_u1} = a_{u2\_v2} = -k_1 \\ a_{w1\_v1} = a_{v2\_w2} = -k_2 \\ a_{u1\_w1} = a_{w2\_u2} = -k_3 \end{cases} \quad (23)$$

In the present embodiment, although, for example, the method is described in which the current detection errors can be reduced to zero owing to cancellation among coefficients included in the error components, needless to say that current detection errors do not need to be made exactly zero by the cancellation and need to be at least those within an extent to which the required performance is satisfied. When the detection errors of the magnetic sensors disposed in the first current arrangement positions are $\Delta I_{d1}$ and $\Delta I_{q1}$, and the true values are $I_{d1r}$ and $I_{q1r}$, and when the detection errors of the magnetic sensors disposed in the second current arrangement positions are $\Delta I_{d2}$ and $\Delta I_{q2}$, and the true values are $I_{d2r}$ and $I_{q2r}$, the output torque T is expressed by Formula (24).

$$T = P_m[(I_{q1r}+I_{q2r})\varphi + \tfrac{1}{2}(L_d-L_q)(I_{d1r}+I_{d2r})(I_{q1r}+I_{q2r}) + (\Delta I_{q1}+\Delta I_{q2})\varphi + \tfrac{1}{2}(L_d-L_q)\{(\Delta I_{d1}+\Delta I_{d2})(I_{q1r}+I_{q2r}) + (I_{d1r}+I_{d2r})(\Delta I_{q1}+\Delta I_{q2})\}] \quad (24)$$

The error component of the output torque Terr is given by Formula (25).

$$T_{err} = P_m[(\Delta I_{q1}+\Delta I_{q2})\varphi + \tfrac{1}{2}(L_d-L_q)\{(\Delta I_{d1}+\Delta I_{d2})(I_{q1r}+I_{q24}) + (I_{d1r}+I_{d2r})(\Delta I_{q1}+\Delta I_{q2})\}] \quad (25)$$

In order for the error component expressed in Formula (24) to be reduced within the requirement for the accuracy of the output torque or the torque ripple, following Formula (26) or Formula (27) needs to be satisfied.

$$|\Delta I_{d1}+\Delta I_{d2}| = |\Delta I_d| < \delta_d \quad (26)$$

$$|\Delta I_{q1}+\Delta I_{q2}| = |\Delta I_q| < \delta_q \quad (27)$$

Here, $\Delta I_d = \Delta I_{d1}+\Delta I_{d2}$, $\Delta I_q = \Delta I_{q1}+\Delta I_{q2}$, and $\Delta I_d$ represents the error component of the d-axis sum current, and $\Delta I_q$ represents the error component of the q-axis sum current.

For example, in an AC rotating machine without saliency, where $L_d = L_q$, the error component of the output torque is expressed by Formula (28), and thus when an upper limit value of the error of the output torque is $T_{lim}$, $\delta_q$ needs to be given by Formula (29). In the same way, an upper limit value of $\delta_d$ also can be given.

For example, although the error of the output torque due to an approximation error in Formulas (18) and (21) may be produced, there is no problem as long as the error is within the upper limit value of the error of the output torque.

$$T_{err} = P_m(\Delta I_{q1} + \Delta I_{q2})\varphi \quad (28)$$

$$\delta_q = \frac{T_{lim}}{P_m\varphi} \quad (29)$$

In addition, needless to say that the arrangement in the equal intervals, in the point-symmetry, or in the line-symmetry described in the present embodiment allows a positional variation that causes an error within the upper limit value of the error of the output torque.

Second Embodiment

Figure 17:
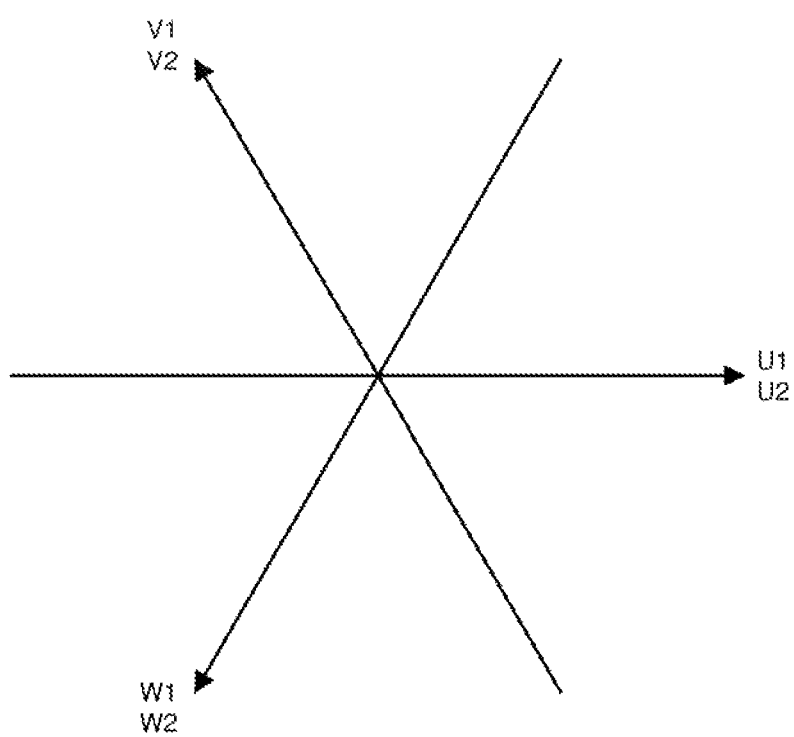
FIG. 17 is a diagram showing a relationship between current phases in a current detection apparatus according to a second embodiment.

In a second embodiment, in the case where the phase difference between the two three-phase windings is zero as shown in FIG. 17, it will be described which phase of a current path needs to be arranged at which current path arrangement position. A current detection apparatus in the second embodiment is only different from the first embodiment in the phase difference between the first three-phase windings and the second three-phase windings, and thus repetitive descriptions with respect to the first embodiment will be omitted.

Since currents of two corresponding phases are almost equal, in the case where the phase difference between the first three-phase windings and the second three-phase windings is zero, a well-known control in which failure is detected by comparing the two currents or, continuous operation is kept using a detection value of one magnetic sensor when the other magnetic sensor is in failure can be applicable.

A DC component $I_{d\_sum\_dc}$ and an AC component $I_{d\_sum\_ac}$ of the d-axis sum current are respectively given by Formulas (30) and (31). Since the q-axis sum current is expressed by a formula having the same coefficients and the phases only different by $\pi/2$ with respect to the d-axis sum current, reduction of the error component in the d-axis sum current will be described below.

$$I_{d\_sum\_dc} = \frac{1}{\sqrt{6}} \quad (30)$$

$$\{(a_{u1\_u1} + a_{v1\_v1} + a_{w1\_w1} + a_{u2\_u2} + a_{v2\_v2} + a_{w2\_w2})\sin\!\left(\beta + \frac{\pi}{2}\right) +$$
$$(a_{u1\_u2} + a_{v1\_v2} + a_{w1\_w2} + a_{u2\_u1} + a_{v2\_v1} + a_{w2\_w1})$$
$$\sin\!\left(\beta + \frac{\pi}{2}\right) +$$
$$(a_{u1\_v1} + a_{v1\_w1} + a_{w1\_u1} + a_{u2\_v2} + a_{v2\_w2} + a_{w2\_u2} + a_{u1\_v2} +$$
$$a_{v1\_w2} + a_{w1\_u2} + a_{u2\_v1} + a_{v2\_w1} + a_{w2\_u1})\sin\!\left(\beta + \frac{7}{6}\pi\right) +$$
$$(a_{u1\_w1} + a_{v1\_u1} + a_{w1\_v1} + a_{u2\_w2} + a_{v2\_u2} + a_{w2\_v2} + a_{u1\_w2} +$$
$$a_{v1\_u2} + a_{w1\_v2} + a_{u2\_w1} + a_{v2\_u1} + a_{w2\_v1})\sin\!\left(\beta + \frac{11}{6}\pi\right)\}$$

$$I_{d\_sum\_ac} = \quad (31)$$

$$\frac{1}{\sqrt{6}}\{(a_{u1\_u1} + a_{u2\_u2} + a_{v1\_w1} + a_{w1\_v1} + a_{v2\_w2} + a_{w2\_v2} + a_{u1\_u2} +$$
$$a_{v1\_w2} + a_{w1\_v2} + a_{u2\_u1} + a_{v2\_w1} + a_{w2\_v1})$$
$$\sin\!\left(2\theta + \beta + \frac{\pi}{2}\right) + (a_{v1\_v1} + a_{v2\_v2} + a_{u1\_w1} + a_{w1\_u1} +$$
$$a_{u2\_w2} + a_{w2\_u2} + a_{u1\_w2} + a_{v1\_v2} + a_{w1\_u2} +$$
$$a_{u2\_w1} + a_{v2\_v1} + a_{w2\_u1})\sin\!\left(2\theta + \beta + \frac{7}{6}\pi\right) +$$
$$(a_{w1\_w1} + a_{w2\_w2} + a_{u1\_v1} + a_{v1\_u1} + a_{u2\_v2} + a_{v2\_u2} +$$
$$a_{v1\_v2} + a_{v1\_u2} + a_{w1\_w2} + a_{u2\_v1} +$$
$$a_{v2\_u1} + a_{w2\_w1})\sin\!\left(2\theta + \beta + \frac{11}{6}\pi\right)\}$$

As shown in FIG. 3, in the case where the first current path arrangement position and the second current path arrangement positions are alternately arranged on the circle, and in the combinations C1, C3, and C5 in FIG. 6, although the error of the DC component in the sum current remains, the error of the AC component in the sum current can be reduced. That is, the error terms of the AC component satisfy the condition (B). Further, in the combinations C2, C4, and C6 in FIG. 6, both of the errors of the DC and AC components in the sum currents can be reduced. That is, the error terms of the DC component satisfy the condition (A), and the error terms of the AC component satisfy the condition (B).

As shown in FIG. 11, in the case where the first current path arrangement positions themselves may be arranged at equal intervals, the second current path arrangement positions themselves may be arranged at equal intervals, and the first current path arrangement positions and the second current path arrangement positions may be alternately arranged at non-equal intervals, and in the combination C1 in FIG. 12, although the error of the DC component in the sum current remains, the error of the AC component in the sum current can be reduced. That is, the error terms of the AC component satisfy the condition (B). Further, in the combination C2 in FIG. 12, both of the errors of the DC and AC components in the sum currents can be reduced. That is, the error terms of the DC component satisfy the condition (A), and the error terms of the AC component satisfy the condition (B).

As shown in FIG. 13, in the case where the first current path arrangement positions and the second current path arrangement positions are arranged separately into two ranges of π rad in the circumferential direction, and in the combination C1 of FIG. 14, although the error of the DC component in the sum current remains, the error of the AC component in the sum current can be reduced. That is, the error terms of the AC component satisfy the condition (B). Further, in the combination C2 in FIG. 14, both of the errors of the DC and AC components in the sum currents can be reduced. That is, the error terms of the DC component satisfy the condition (A), and the error terms of the AC component satisfy the condition (B).

As shown in FIG. 15, in the case where the first current path arrangement positions and the second current path arrangement positions are arranged point-symmetrically, and in the combination C1 in FIG. 14, although the error of the DC component in the sum current remains, the error of the AC component in the sum current can be reduced. That is, the error terms of the AC component satisfy the condition (B). Further, in the combinations C2 in FIG. 14, both of the errors of the DC and AC components in the sum currents can be reduced. That is, the error terms of the DC component satisfy the condition (A), and the error terms of the AC component satisfy the condition (B).

As shown in FIG. 16, in the case where the first current path arrangement positions and the second current path arrangement positions may be arranged line-symmetrically, and in the combination C1 in FIG. 14, although the error of the DC component in the sum current remains, the error of the AC component in the sum current can be reduced. That is, the error terms of the AC component satisfy the condition (B). Further, in the combination C2 in FIG. 14, both of the errors of the DC and AC components in the sum currents can be reduced. That is, the error terms of the DC component satisfy the condition (A), and the error terms of the AC component satisfy the condition (B).

Third Embodiment

Figure 18:
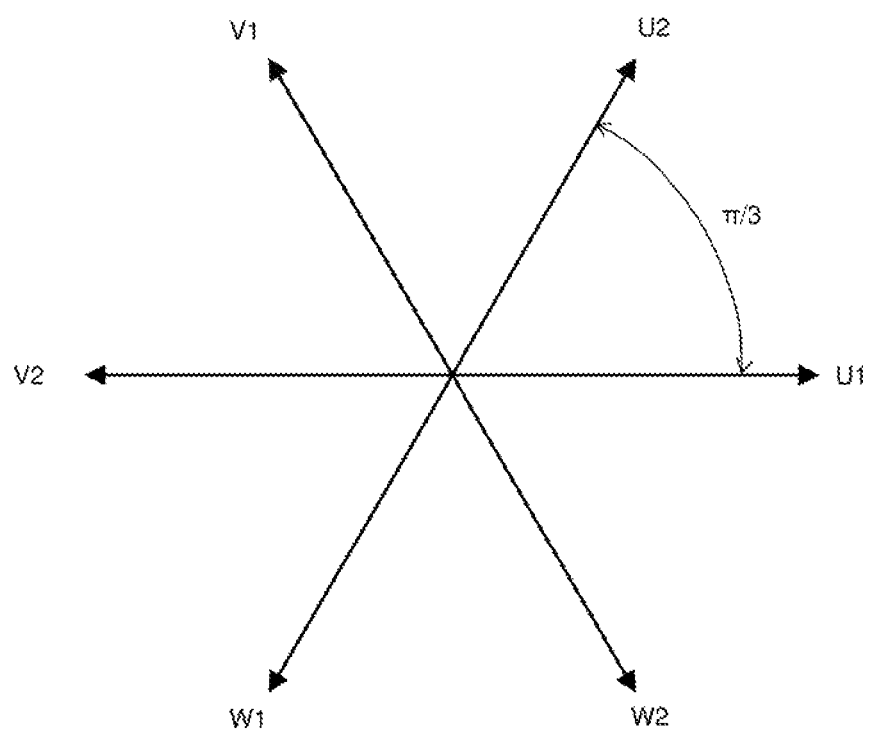
FIG. 18 is a diagram showing a relationship between current phases in a current detection apparatus according to a third embodiment.

In a third embodiment, in a case in which the phase difference between the two set of three-phase windings is π/3 as shown in FIG. 18, it will be described which phase of a current path needs to be arranged at which current path arrangement position. A current detection apparatus in the third embodiment is only different from the first embodiment in the phase difference between the first three-phase windings and the second three-phase windings, and thus repetitive descriptions with respect to the first embodiment will be omitted.

Since currents with the phase difference of π exist in the case where the phase difference between the first three-phase windings and the second three-phase windings is π/3, a well-known control in which failure is detected by comparing the two currents or, continuous operation is kept using a detection value of one magnetic sensor when the other magnetic sensor is in failure can be applicable.

A DC component $I_{d\_sum\_dc}$ and an AC component $I_{d\_sum\_ac}$ of the d-axis sum current are respectively given by Formulas (32) and (33). Since the q-axis sum current is expressed by a formula having the same coefficients and the phases only different by π/2 with respect to the d-axis sum current, reduction of the error component in the d-axis sum current will be described below.

$$I_{d\_sum\_dc} = \frac{1}{\sqrt{6}} \tag{32}$$

$$\left\{(a_{u1\_u1} + a_{v1\_v1} + a_{w1\_w1} + a_{u2\_u2} + a_{v2\_v2} + a_{w2\_w2})\sin\left(\beta + \frac{\pi}{2}\right) + \right.$$
$$(a_{u1\_w2} + a_{v1\_u2} + a_{w1\_v2} + a_{u2\_u1} + a_{v2\_v1} + a_{w2\_w1})$$
$$\sin\left(\beta + \frac{\pi}{6}\right) + (a_{u1\_v2} + a_{v1\_v2} + a_{w1\_w2} +$$
$$a_{u2\_v1} + a_{v2\_w1} + a_{w2\_u1})\sin\left(\beta + \frac{5}{6}\pi\right) +$$
$$(a_{u1\_v2} + a_{v1\_w2} + a_{w1\_u2} + a_{u2\_w1} + a_{v2\_u1} + a_{w2\_v1})$$
$$\sin\left(\beta + \frac{3}{2}\pi\right) +$$
$$(a_{u1\_v1} + a_{v1\_w1} + a_{w1\_u1} + a_{u2\_v2} + a_{v2\_w2} + a_{w2\_u2})$$
$$\sin\left(\beta + \frac{7}{6}\pi\right) +$$
$$(a_{u1\_w1} + a_{v1\_u1} + a_{w1\_v1} + a_{u2\_w2} + a_{v2\_u2} + a_{w2\_v2})$$
$$\left.\sin\left(\beta + \frac{11}{6}\pi\right)\right\}$$

$$I_{d\_sum\_ac} = \tag{33}$$

$$\frac{1}{\sqrt{6}}\left\{(a_{u1\_u1} + a_{v2\_v2} + a_{v1\_w1} + a_{w1\_v1} + a_{u2\_w2} + a_{w2\_u2})\sin\left(\right.\right.$$
$$2\theta + \beta + \frac{\pi}{2}\right) +$$
$$(a_{v1\_v1} + a_{w2\_w2} + a_{u1\_w1} + a_{w1\_u1} + a_{u2\_v2} + a_{v2\_u2})$$
$$\sin\left(2\theta + \beta + \frac{7}{6}\pi\right) +$$
$$(a_{w1\_w1} + a_{u2\_u2} + a_{u1\_v1} + a_{v1\_u1} + a_{v2\_w2} + a_{w2\_v2})$$
$$\sin\left(2\theta + \beta + \frac{11}{6}\pi\right) +$$
$$(a_{u1\_u2} + a_{v1\_w2} + a_{w1\_v2} + a_{u2\_u1} + a_{v2\_u1} + a_{w2\_v1})$$
$$\sin\left(2\theta + \beta + \frac{3}{2}\pi\right) +$$
$$(a_{u1\_w2} + a_{v1\_v2} + a_{w1\_u2} + a_{u2\_w1} + a_{v2\_v1} + a_{w2\_u1})$$
$$\sin\left(2\theta + \beta + \frac{\pi}{6}\right) +$$
$$(a_{u1\_v2} + a_{v1\_u2} + a_{w1\_w2} + a_{u2\_v1} + a_{v2\_u1} + a_{w2\_w1})$$
$$\left.\sin\left(2\theta + \beta + \frac{5}{6}\pi\right)\right\}$$

As shown in FIG. 3, in the case where the first current path arrangement position and the second current path arrangement positions are alternately arranged on the circle, and in the combinations C1, C3, and C5 in FIG. 6, although the error of the DC component in the sum current remains, the error of the AC component in the sum current can be reduced. That is, the terms from the first to the third in the AC component satisfy the condition (B) and the terms from the fourth to the sixth therein satisfy the condition (A). Further, in the combinations C2, C4, and C6 in FIG. 6, both of the errors of the DC and AC components in the sum currents can be reduced. That is, the error terms of the DC component satisfy the condition (A), the error terms from the first to the third in the AC component satisfy the condition (B), and the error terms from the fourth to the sixth in the AC component satisfy the condition (A).

As shown in FIG. 11, in the case where the first current path arrangement positions themselves may be arranged at equal intervals, the second current path arrangement positions themselves may be arranged at equal intervals, and the first current path arrangement positions and the second current path arrangement positions may be alternately arranged at non-equal intervals, and in the combination C1 in FIG. 12, although the error of the DC component in the sum current remains, the error of the AC component in the sum current can be reduced. That is, the error terms from the first to the third in the AC component satisfy the condition (B) and the error terms from the fourth to the sixth therein satisfy the condition (A). Further, in the combination C2 in FIG. 12, both of the errors of the DC and AC components in the sum currents can be reduced. That is, the error terms of the DC component satisfy the condition (A), the error terms from the first to the third in the AC component satisfy the condition (B), and the error terms from the fourth to the sixth in the AC component satisfy the condition (A).

As shown in FIG. 13, in the case where the first current path arrangement positions and the second current path arrangement positions are arranged separately into two ranges of n rad in the circumferential direction, and in the combination C1 of FIG. 14, although the error of the DC component in the sum current remains, the error of the AC component in the sum current can be reduced. That is, the error terms from the first to the third in the AC component satisfy the condition (B) and the error terms from the fourth to the sixth in the AC component satisfy the condition (A). Further, in the combination C2 in FIG. 14, both of the errors of the DC and AC components in the sum currents can be reduced. That is, the error terms of the DC component satisfy the condition (A), the error terms from the first to the third in the AC component satisfy the condition (B), and the error terms from the fourth to the sixth in the AC component satisfy the condition (A).

As shown in FIG. 15, in the case where the first current path arrangement positions and the second current path arrangement positions are arranged point-symmetrically, and in the combination C1 in FIG. 14, although the error of the DC component in the sum current remains, the error of the AC component in the sum current can be reduced. That is, the error terms from the first to the third in the AC component satisfy the condition (B) and the error terms from the fourth to the sixth in the AC component satisfy the condition (A). Further, in the combinations C2, in FIG. 14, both of the errors of the DC and AC components in the sum currents can be reduced. That is, the error terms of the DC component satisfy the condition (A), the error terms from the first to the third in the AC component satisfy the condition (B), and the error terms from the fourth to the sixth in the AC component satisfy the condition (A).

As shown in FIG. 16, in the case where the first current path arrangement positions and the second current path arrangement positions may be arranged line-symmetrically, and in the combination C1 in FIG. 14, although the error of the DC component in the sum current remains, the error of the AC component in the sum current can be reduced. That is, the error terms from the first to the third in the AC component satisfy the condition (B) and the error terms from the fourth to the sixth therein satisfy the condition (A). Further, in the combination C2 in FIG. 14, both of the errors of the DC and AC components in the sum currents can be reduced. That is, the error terms of the DC component satisfy the condition (A), the error terms from the first to the third in the AC component satisfy the condition (B), and the error terms from the fourth to the sixth in the AC component satisfy the condition (A).

Note that, in a case of a set of six-phase windings, the same advantageous effect can be obtained by assigning corresponding phases to U1 though W2 in the present embodiment.

Fourth Embodiment

Figure 19:
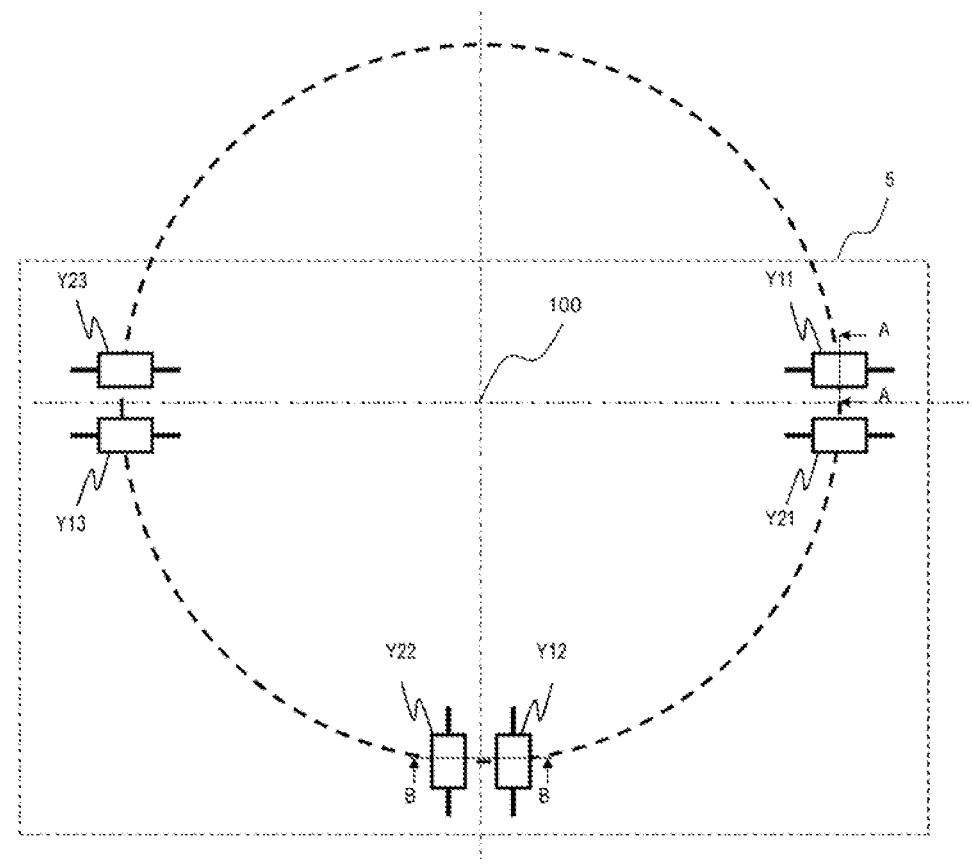
FIG. 19 is a diagram showing current path arrangement positions in a current detection apparatus according to a fourth embodiment.

FIG. 19 is a schematic diagram showing current path arrangement positions viewed from the direction in which a rotor axis 100 of the AC rotating machine 1 extends, in the current detection apparatus according to a fourth embodiment. 2n current path arrangement positions are provided for the arrangement positions of current detectors with 2n phases, where n equals three. The current detection apparatus 5 is configured with the current detectors that are arranged in the first current path arrangement positions Y11, Y12, and Y13 and the second current path arrangement positions Y21, Y22, and Y23. Magnetic sensors included in the current detectors and arranged in Y11, Y12, Y13. Y21, Y22, and Y23 each detect any one of the current detection values $i_{u1s}$, $i_{v1s}$, $i_{w1s}$, $i_{u2s}$, $i_{v2s}$, and $i_{w2s}$. Y11 and Y21, Y12 and Y22, and Y13 and Y23 are arranged to be adjacent to each other. As shown in FIG. 4, in the first current path arrangement position Y11, a first magnetic sensor S11 detects the magnetic field generated from a first current path X1, and i11 is obtained. Further, for example, as shown in FIG. 5, a configuration may be adopted in which a magnetic field generated from the first current path X1 is collected using a magnetic material 50 and detected by the first magnetic sensor S11. In FIG. 4 or FIG. 5, it is assumed that the power converter 4a or the power converter 4b is positioned on the back side of the paper plane, and the AC rotating machine 1 is connected thereto on the front side of the paper plane, and thus the current flows in a direction from the power converter to the AC rotating machine as a positive current. Although not shown in the figures, similar to the first current path arrangement position Y11, in the first current path arrangement position Y12, the first magnetic sensor S12 detects the magnetic field generated from a first current path X12, and i12 is obtained, and in the first current path arrangement position Y13, the first magnetic sensor S13 detects the magnetic field generated from a first current path X13, and i13 is obtained. Further, in the second current path arrangement position Y21, the second magnetic sensor S21 detects the magnetic field generated from the second current path X21, and i21 is obtained. In the second current path arrangement position Y22, the second magnetic sensor S22 detects the magnetic field generated from the second current path X22, and i22 is obtained. In the second current path arrangement position Y23, the second magnetic sensor S23 detects the magnetic field generated from the second current path X23, and i23 is obtained.

In the following description, it will be explained which current path arrangement position is appropriate to arrange each of the current paths for the six phases U1 to W2. In a case where current detection values are normalized assuming that all amplitudes of the currents for all the phases are equal, the current detection values $i_{u1s}$, $i_{v1s}$, $i_{w1s}$, $i_{u2s}$, $i_{v2s}$, and $i_{w2s}$ are given by Formula (1) that is described in the first embodiment. The three-phase currents that are detected can be converted into dq-axis currents on the basis of Formula (2) and Formula (3). Using the fact that the differential currents ($I_{d1}-I_{d2}$ and $I_{q1}-I_{q2}$) are substantially small as compared to the sum currents ($I_{d1}+I_{d2}=I_d$, and $I_{q1}+I_{q2}=I_q$), an output torque is given by Formula (4). Thus, by decreasing a detection error included in the sum currents, the output torque accuracy can be improved or an output torque ripple can be reduced.

The d-axis sum current $I_d$ ($I_{d1}+I_{d2}$) is expressed by the sum of a DC component $I_{d\_sum\_dc}$ and an AC component $I_{d\_sum\_ac}$, and the q-axis sum current $I_q$ ($I_{q1}+I_{q2}$) is expressed by the sum of a DC component $I_{q\_sum\_dc}$ and an AC component $I_{q\_sum\_ac}$, and these components are given by respective formulas (5) to (8).

In each formula, when a part expressed by a sine function with the same phase is regarded as a term, terms from the second to the sixth in Formulas (5) and (7) correspond to error components. In the second term to the fourth term, their phases are different by $(2/3)\pi$ in order. If the amplitude of the sine function in each term is equal, the sum from the second term to the fourth term is zero (Condition (B) described in the first embodiment). That is, in order to make the error components zero in Formulas (5) and (7), the amplitudes from the second term to the fourth term need to be equal, and the amplitudes of the fifth term and the sixth term need to be zero (Condition (A) described in the first embodiment). In Formulas (6) and (8), terms from the first to the ninth correspond to error components. In the first term to the third term, their phases are different by $(2/3)\pi$ in order. If the amplitude of each term is equal, the sum from the first term to the third term is zero (Condition (B)). In the fourth term to the sixth term, their phases are different by $(2/3)\pi$ in order. If the amplitude of each term is equal, the sum from the fourth term to the sixth term is zero (Condition (B)). In the seventh term to the ninth term, their phases are different by $(2/3)\pi$ in order. If the amplitude of each term is equal, the sum from the seventh term to the ninth term is zero (Condition (B)). That is, in order to make the error components zero in Formula (6) and Formula (8), the requirement is that the amplitudes from the first term to the third term are equal, the amplitudes from the fourth term to the sixth term are equal, and the amplitudes from the seventh term to the ninth term are equal.

Figures 20, 21:
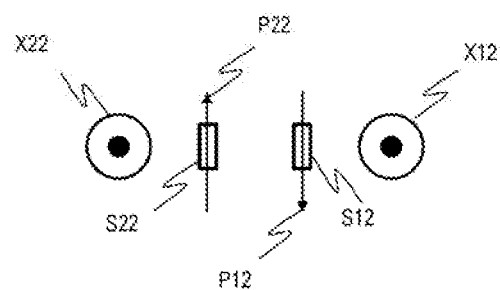
FIG. 20 is a diagram showing an example of a positional relationship between current paths and magnetic sensors in the current detection apparatus according to the fourth embodiment.
FIG. 21 is a diagram showing a table for explaining assignment of current path arrangement in the current detection apparatus according to the fourth embodiment.

FIG. 20 is a schematic diagram showing an arrangement of current paths and magnetic sensors in the first current path arrangement position Y12 and the second current path arrangement position Y22 that are arranged adjacent to each other. The first current path X12, the first magnetic sensor S12, the second magnetic sensor S22, and the second current path X22 are arranged in this order. The direction of generated magnetic field due to the first current path X12 at the position of the first magnetic sensor S12 is downward, and thus the detection axis is P12. The direction of generated magnetic field due to the second current path X22 at the position of the second magnetic sensor S22 is upward, and thus the detection axis is P22. The direction of generated magnetic field due to the second current path X22 at the position of the first magnetic sensor S12 is upward, and thus the direction is opposite to the detection axis P12. The direction of generated magnetic field due to the first current path X12 at the position of the second magnetic sensor S22 is downward, and thus the direction is opposite to the detection axis P22. Therefore, in any of the first magnetic sensors S11 to S13 and the second magnetic sensors S21 to S23, the noise component is a component in the opposite direction to the component that is intended to be obtained.

When the amplitudes in the fifth term and sixth term in Formula (5) are examined, the amplitude of each term is the sum of the noise components between the first three-phase windings and between the second three-phase windings. Thus, if current detectors for the first three-phase windings are not disposed next to each other and current detectors for the second three-phase windings are not disposed next to each other, the amplitudes can be made zero. Since a noise component given to the magnetic sensor for the U1-phase by the current path of the W2-phase is subtracted from a noise component given to the magnetic sensor for the W2-phase by the current path of the U1-phase, the coefficients of the second term are cancelled out, thereby making the amplitude zero even if each noise component exist. In order for the amplitudes of the third and fourth terms to be equal to the amplitude of the second term, they need to be zero.

As shown in FIG. 21, six combinations in which current phases are assigned to the first current paths X11 to X13 and the second current paths X21 to X23 are considered. When V1 phase is to be assigned to X11, U, V, and W need to be replaced by V, W, and U in FIG. 21, respectively. When W1 phase is to be assigned to X11, U, V, and W need to be replaced by W, U and V in FIG. 21, respectively.

In the case of the combination C3, for the pairs of the current paths arranged in the adjacent current path arrangement positions (X11, X21), (X12, X22), and (X13, X23), coefficients are given by Formula (34).

$$a_{u1\_v2}=a_{v2\_u1}=a_{v1\_w2}=a_{w2\_v1}=a_{w1\_u2}=a_{u2\_w1}=k_1 \qquad (34)$$

Since other coefficients except for those in Formulas (9) and (34) are quite smaller than one or $k_1$, they can be regarded as zero. The amplitudes in the third term and the fourth term in Formula (5) cannot be made zero. However, the amplitudes in the fourth term to the sixth term that are different in their phases in Formula (6) can be made equal, and the three terms from the fourth term to the sixth term each having a different phase are cancelled out, so that the values of these error terms become zero as a whole from the fourth term to the sixth term. That is, the condition (B) described in the first embodiment is satisfied. Accordingly, the output torque ripple can be reduced, although accuracy of the output torque cannot be achieved. The same applies to the combination C5. Note that, the adjacent current path arrangement positions need to be close to each other in such a way that the value of the coefficient $a_{l\_k}$ between two non-adjacent current paths is negligible with respect to the value of the coefficient $a_{l\_k}$ between adjacent two current paths. Specifically, the distance between the adjacent two current paths needs to be not greater than 0.2 times the distance between non-adjacent current paths that is the shortest.

In the case of the combination C2, coefficients in the pairs of the current paths arranged at the adjacent current path arrangement positions are given by Formula (35).

$$a_{u1\_w2}=a_{w2\_u1}=a_{v1\_v2}=a_{v2\_v1}=a_{w1\_u2}=a_{u2\_w1}=k_1 \qquad (35)$$

Since other coefficients except for those in Formulas (9) and (35) are quite smaller than one or $k_1$, they can be regarded as zero. The amplitudes from fourth term to the sixth term in Formula (6) cannot be made equal. However, the amplitudes in the third term and the fourth term in Formula (5) can be made zero. That is, the condition (A) is satisfied. Accordingly, although the output torque ripple cannot be reduced, accuracy of the output torque can be achieved. The same applies to the combinations C4 and C6.

Further, in the case of the combination C1, coefficients in the pairs of the current paths arranged at the adjacent current path arrangement positions are given by Formula (36).

$$a_{u1\_w2}=a_{w2\_u1}=a_{v1\_u2}=a_{u2\_v1}=a_{w1\_v2}=a_{v2\_w1}=k_1 \qquad (36)$$

Since other coefficients except for those in Formulas (9) and (36) are quite smaller than one or $k_1$, they can be regarded as zero. The amplitudes from third term and the fourth term in Formula (5) can be made zero. In addition, the amplitudes from the fourth term to the sixth term in Formula (6) can be made equal. That is, the conditions (A) and (B) are satisfied. Accordingly, accuracy of the output torque can be achieved while the output torque ripple can be reduced. That is, for example, in the case where the current detection apparatus according to the present embodiment is used for a controlled object such as a generator motor for a vehicle where accuracy of the output torque is required, one of the combinations C1, C2, C4, and C6 may be selected. In the case where the current detection apparatus according to the present embodiment is used for a controlled object such as a rotating machine for an electric power steering system where the output torque ripple needs to be reduced, one of the combinations C1, C3, and C5 may be selected.

In other words, phases of currents flowing in the first current paths X11 to X1$n$ are made to be advanced by $2\pi/n$ in order and phases of currents flowing in the second current paths X21 to X2$n$ are made to be advanced by $2\pi/n$ in order, and thus a new advantageous effect of the reduction of the output torque ripple can be obtained. Further, phases of currents flowing in the first current paths X11 to X1$n$ are made to be advanced by $2\pi/n$ in order and phases of currents flowing in the second current paths X21 to X2$n$ are made to be delayed by $2\pi/n$ in order, and thus a new advantageous effect of the improvement in the accuracy of the output torque can be obtained. Furthermore, when k is a natural number from 1 to n, and the phase difference between the currents in the first current path X1$k$ and the second current path X2$k$ is made to be $\pi/2$ (C1 in FIG. 21), a new advantageous effect of both the reduction of the output torque ripple and the improvement of accuracy of the output torque can be obtained.

Note that, although the AC rotating machine including two sets of three-phase windings is described here, the formula representing error components need to consist of three sine functions whose phases are different by $(2/3)\pi$ in order, and thus the same advantageous effect can be obtained in the case of two sets of n-phase windings when n is a multiple of three.

In FIG. 20, the direction of the magnetic field generated from the second current path X22 in the detection axis P12 of the first magnetic sensor S12 for the magnetic field generated from the first current path X12 and the direction of the magnetic field generated from the first current path X12 in the detection axis P22 of the second magnetic sensor S22 for the magnetic field generated from the second current path X22 are both opposite to the direction of their detection axis. With the arrangement described above, the improvement of accuracy of the output torque in addition to the reduction of the torque ripple can be achieved using the fact that, in the second term of Formula (5), the coefficient for each of the three pairs (U1 and W2, V1 and U2, W1 and V2) appears twice with a different sign to each other.

The closest current path of one phase to a magnetic sensor belongs to a current detector of the one phase, and the second closest current path of another phase belongs to the adjacent current detector. Thus, a new advantageous effect can be obtained as follows. That is, influence from the current paths of the remaining four phases can be relatively made small, and out of the 36 coefficients of $a_{u1\_u1}$ to $a_{w2\_w2}$ in Formula (1), the target to be considered for reducing the current detection error can be limited to 12.

Figure 22:
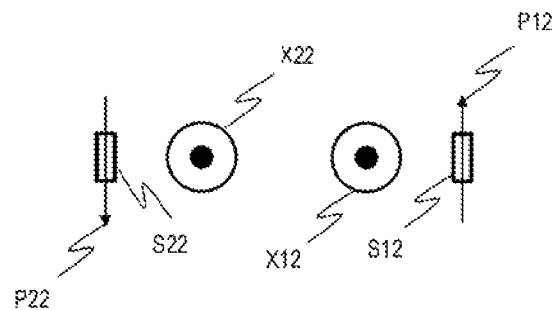
FIG. 22 is a diagram showing another example of a positional relationship between current paths and magnetic sensors in the current detection apparatus according to the fourth embodiment.

Although the case in the arrangement shown in FIG. 20 is described so far, in the first current path arrangement position Y12 and the second current path arrangement position Y22, the first magnetic sensor S12, the first current path X12, the first magnetic sensor S12, the second current path X22, and the second magnetic sensor S22 may be arranged in this order as shown in FIG. 22. In this case, since the direction of the magnetic field generated from the first current path X12 at the position of the first magnetic sensor S12 is upward, the detection axis is P12. Since the direction of the magnetic field generated from the second current path X22 at the position of the second magnetic sensor S22 is downward, the detection axis is P22. Since the direction of the magnetic field generated from the second current path X22 at the position of the first magnetic sensor S12 is upward, the direction is the same as the direction of the detection axis P12. Since the direction of the magnetic field generated from the first current path X12 at the position of the second magnetic sensor S22 is downward, the direction is the same as the direction of the detection axis P22. Similarly, Formulas (5) to (8) are established in this case. Thus, the direction of the magnetic field generated from the second current path X22 in the detection axis P12 of the first magnetic sensor S12 for the magnetic field generated from the first current path X12 and the direction of the magnetic field generated from the first current path X12 in the detection axis P22 of the second magnetic sensor S22 for the magnetic field generated from the second current path X22 are both the same as the direction of their detection axis. With the arrangement made described above, the improvement of accuracy of the output torque in addition to the reduction of the torque ripple can be achieved using the fact that, in the second term of Formula (5), the coefficient for each of the three pairs (U1 and W2, V1 and U2, W1 and V2) appears twice with a different sign to each other. It is noted that, by arranging the magnetic sensors and the current paths side by side on a straight line as shown in FIG. 20 and FIG. 22, it is also possible to obtain an advantageous effect of reducing the size of the current detection apparatus in the front-to-back direction of the paper.

Figure 23:
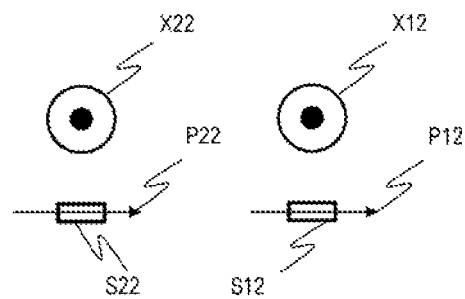
FIG. 23 is a diagram showing still another example of a positional relationship between current paths and magnetic sensors in the current detection apparatus according to the fourth embodiment.

In addition, although the magnetic sensors and the current paths are arranged side by side on the straight line in FIG. 20 and FIG. 22, when the current paths and the magnetic sensors are arranged side by side on separate straight lines as shown in FIG. 23, the same effect can be obtained. That is, in the adjacent current path arrangement positions of the first current path arrangement positions and the second current path arrangement positions, the first current path and the second current path are arranged on the same plane, and the first magnetic sensor and the second magnetic sensor are arranged together on the other same plane, so that ease of installation can be enhanced.

Figure 24:
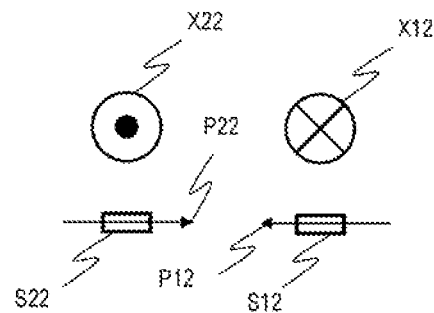
FIG. 24 is a diagram showing still another example of a positional relationship between current paths and magnetic sensors in the current detection apparatus according to the fourth embodiment.
Figure 25:
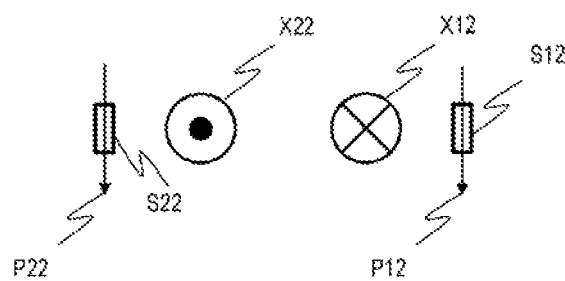
FIG. 25 is a diagram showing still another example of a positional relationship between current paths and magnetic sensors in the current detection apparatus according to the fourth embodiment.

Note that, as shown in FIG. 24 or FIG. 25, regarding the connection direction between the AC rotating machine 1 and the power converter 4$a$ or the power converter 4$b$, even if the connection direction of the first current path X12 is reversed to that of the second current path X22, it is possible to obtain the same effect by appropriately arranging the six phases. However, as shown in FIG. 20, FIG. 22, and FIG. 23, regarding the connection direction between the AC rotating machine 1 and the power converter 4$a$ or the power converter 4$b$, it is a matter of course that, if the first current path X12 and the second current path X22 are the same in the connection direction, the wiring is easier to be disposed and this can contribute to downsizing. In the arrangement for the current path and the magnetic sensor at adjacent two current path arrangement positions, a plurality of types of arrangements may be used in combination.

The magnetic field generated by the rotor of the AC rotating machine and transmitted through the shaft being the axle of the rotor is a disturbance to the magnetic sensor. However, the current path arrangement positions are set on the same circle whose center is the rotor axis 100 as shown in FIG. 19, so that disturbance magnetic field at each of the magnetic sensors can be made equal. Thus, in-phase noise can be cancelled out on the dq-axis, and thereby the influence on the output torque can be reduced. Note that, it is not a requirement that the center of the circle coincides with the rotor axis 100. For example, if the leak of the magnetic field from the shaft at the positions where magnetic sensors are disposed is small, the influence of the noise caused by the leak of the magnetic field from the shaft is small even if the center of the circle does not coincide with the rotor axis.

Fifth Embodiment

Figure 26:
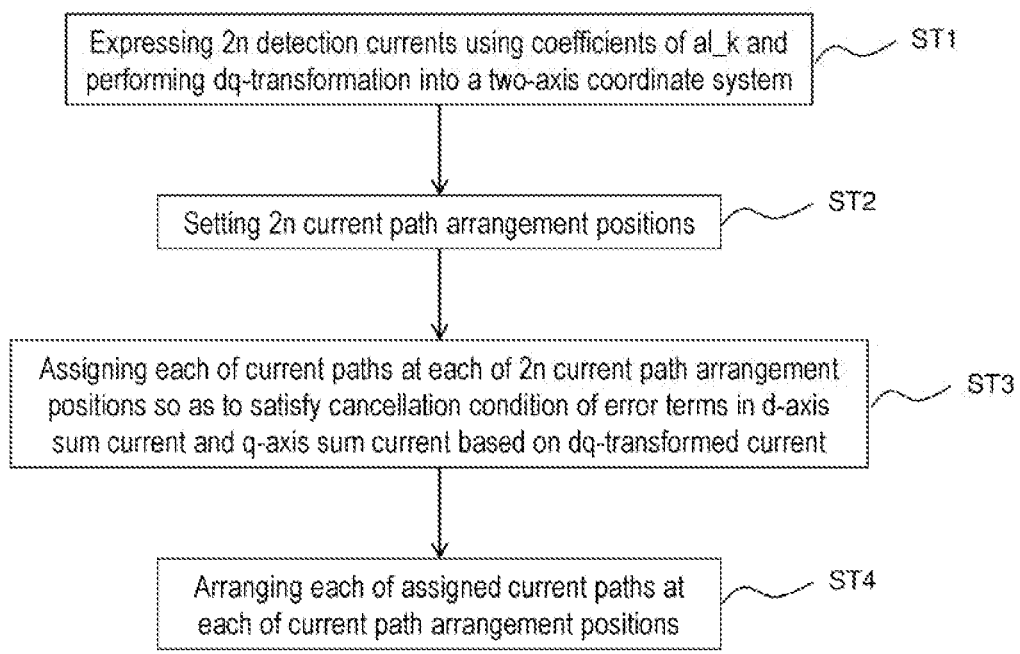
FIG. 26 is a flowchart for explaining a method of manufacturing a current detection apparatus according to a fifth embodiment.

In a fifth embodiment, a method of manufacturing a current detection apparatus in which an arrangement of a current path of each phase described in the first to fourth embodiments is determined will be described in a collective manner. FIG. 26 is a flowchart showing a flow in a manufacturing method of the current detection apparatus according to the fifth embodiment.

First, each of detection currents $i_{ks}$ that is detected by a magnetic sensor for each of the windings with 2n phases is expressed by Formula (37) using $a_{l\_k}$ (k and l are integers from 1 to n).

$$i_{ks} = \sum_{l=1}^{2n} a_{l\_k} \times I_l \quad (k = 1 \sim 2n) \qquad (37)$$

Here, $I_l$ is a current value for an l-phase. The coefficient $a_{l\_k}$ represents a ratio at which a magnetic sensor disposed at a current path of a k-phase senses a current of the l-phase. In other words, it is a coupling coefficient between the magnetic sensor for the k-phase and the current path of the l-phase.

Formula (1) is for the case of a 2n-phase AC rotating machine (for example, n equals three) in which two sets of three-phase windings whose phase difference is π/6 are included, and Formula (37) that is represented for a current detection apparatus in a rotating machine having windings with 2n phases is an generalized expression from Formula (1). The currents are normalized on the assumption that all the amplitudes of $I_l$ are equal, and expressed in Formula (1). For example, assuming $a_{k\_k}$ is one, the coefficient $a_{l\_k}$ can be indicated as a ratio of how much the magnetic sensor of the k-phase detects the current of the l-phase. Then, it is necessary to determine the signs of the coefficients by considering the direction of the currents of the k-phase and the l-phase and the direction of the magnetic flux generated at the position of the magnetic sensor of the k-phase by the l-phase current. In conventional current detection apparatuses, for example, a magnetic sensor is provided with magnetic shielding or a magnetic sensor for the k-phase is disposed sufficiently far away from all the current paths of the l-phases, where l≠k, or a correction conductor is disposed so as to add a correction current, and thereby values of the coefficients $a_{l\_k}$, where l≠k, are made negligibly small as compared with the value of $a_{k\_k}$. In the present application as described in the first to fourth embodiments, when at least the coefficients $a_{l\_k}$ (l≠k) have effective values that cannot be ignored as compared with the value of $a_{k\_k}$, the current path arrangements are determined by focusing on the fact that there are current path arrangements in which the values of the error terms are reduced or made zero by the cancellation among coefficients $a_{l\_k}$ (l≠k) having effective values. The above is the distinctive feature of the present application.

Next, using 2n-phase currents expressed by Formula (37), a dq-transformation into a two-axis coordinate system is performed on these currents (step ST1). Then, 2n current path arrangement positions are set as current path positions where each of the magnetic sensors is disposed to face each of 2n current paths (step ST2). So far at this step, it is not determined which phase current path is arranged at which current path arrangement position. In addition, the order of step ST1 and step ST2 may be reversed.

On the assumption that n is a multiple of three and all amplitudes of $I_l$ are equal, the d-axis sum current and the q-axis sum current based on the dq-transformed current can be represented collectively with each of terms of sine functions with different phases to one another by putting together terms expressed by sine functions with the same phase. In the case of a 2n-phase AC rotating machine (for example, n equals three) in which two sets of three-phase windings whose phase difference is π/6 as shown in FIG. 2 are included, the d-axis sum current and the q-axis sum current are represented by Formulas (5) to (8). In this way, on the assumption that n is a multiple of three and all amplitudes of $I_l$ are equal, the d-axis sum current and the q-axis sum current based on the dq-transformed current can be represented collectively with each of terms of sine functions with different phases to one another by putting together terms expressed by sine functions with the same phase. Using cancellation among the coefficients $a_{l\_k}$ (l≠k) that have effective values within a term of sine function with the same phase or cancellation among values of terms of sine functions with different phases, each of 2n current paths is assigned to each of 2n current path arrangement positions in such a manner that error terms of the dq-transformed current satisfy at least one of the following conditions (A) and (B) (step ST3).

(A) At least in a term, an amplitude of the term corresponding to an error component is reduced by coefficients being cancelled out, the coefficients being contained in the term.

(B) Error components are reduced by cancellation among values of terms of sine functions with different phases.

Note that, in the current detector according to the fourth embodiment, the 2n current path arrangement positions are set as current path arrangement positions so as to have adjacent two of current path arrangement positions at each of n positions.

As described above, the current detection apparatus is manufactured by arranging a current path with an assigned phase at each current path arrangement position (step ST4). The current detection apparatus that is manufactured in the way described above has a configuration in which the current paths of the respective phases are arranged at the respective arrangement positions so as to satisfy any one of the above conditions (A) and (B).

As can be seen from the above, each of 2n current paths where each of magnetic sensors is disposed to face each of the current paths is assigned to each of the 2n current path arrangement positions so as to satisfy at least one of the conditions (A) and (B), so that a current detection apparatus with a small detection error can be obtained. That is, since it is not necessary to dispose each magnetic sensor far away from other phases, a current detection apparatus that does not require much space and additional members such as a correction conductor or a magnetic shield and that has a small error can be obtained.

Although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

REFERENCE SIGNS LIST

1 AC rotating machine
5 Current detection apparatus
100 Rotor axis
S11, S12, S13, S21, S22, S23 Magnetic sensor
X11, X12, X13, X21, X22, X23 Current path
Y11, Y12, Y13, Y21, Y22, Y23 Current path arrangement position .

What is claimed is:

1. A current detection apparatus comprising
magnetic sensors each disposed to face each of current paths for each of windings with 2n phases (n is a multiple of three) in an AC rotating machine, wherein each of the magnetic sensors is disposed to face each of the current paths at each of 2n current path arrangement positions, a detection current $i_{ks}$ that is detected by a magnetic sensor disposed to face a current path of a k-phase is represented by Formula (a) using a current $I_l$ of an l-phase (l=1 to 2n) being a l-th phase out of the 2n phases and using $a_{l\_k}$ that is a coupling coefficient between a current path of the l-phase and the magnetic sensor disposed to face the current path of the k-phase (k=1 to 2n) being the k-th phase out of the 2n phases, and $$i_{ks} = \sum_{l=1}^{2n} a_{l\_k} \times I_l \quad (k = 1 \sim 2n) \tag{a}$$

in a d-axis sum current and a q-axis sum current that are currents obtained by performing a dq-transformation into a two-axis coordinate system on 2n detection currents $i_{ks}$ on an assumption that all amplitudes of $I_l$ are the same, and when each of a DC component and an AC component in the sum currents is represented collectively with each of terms expressed by sine functions with different phases to one another,
the current paths are arranged to have a positional relationship that satisfies at least one condition out of a first condition in which, at least in one of the terms, an amplitude in the one term corresponding to one of error components is reduced by cancellation among coefficients $a_{l\_k}$ included in the one term, where l≠k, and a second condition in which the error components are reduced by cancellation among values of the terms of sine functions with different phases.

2. The current detection apparatus according to claim 1, wherein, using an error $\delta_d$ and an error $\delta_q$ determined on a basis of accuracy of an output torque or an output torque ripple of the AC rotating machine, an error component of the d-axis sum current $\Delta I_d$ satisfies $|\Delta I_d|<\delta_d$ or an error component of the q-axis sum current $\Delta I_q$ satisfies $|\Delta I_q|<\delta_q$.

3. The current detection apparatus according to claim 1, wherein windings with the 2n phases are made up of two sets of n-phase windings.

4. The current detection apparatus according to claim 3, wherein a phase difference between the two sets of n-phase windings is π/6 rad.

5. The current detection apparatus according to claim 3, wherein a phase difference between the two sets of n-phase windings is zero.

6. The current detection apparatus according to claim 3, wherein a phase difference between the two sets of n-phase windings is π/3 rad.

7. The current detection apparatus according to claim 3, wherein the 2n current path arrangement positions are arranged on the same circle.

8. The current detection apparatus according to claim 7, wherein a center of the same circle is at a position of a rotor axis in the AC rotating machine.

9. The current detection apparatus according to claim 7, wherein the 2n current path arrangement positions are arranged at equal intervals.

10. The current detection apparatus according to claim 7, wherein the 2n current path arrangement positions are set as two sets of n current path arrangement positions, the n current path arrangement positions being arranged at equal intervals, and the current paths corresponding to n-phase windings of each of the two sets of n-phase windings are arranged at the n current path arrangement positions of each of the two sets.

11. The current detection apparatus according to claim 7, wherein the 2n current path arrangement positions are set as two sets of n current path arrangement positions that are arranged point-symmetrically to each other, and the current paths corresponding to n-phase windings of each of the two sets of n-phase windings are arranged at the n current path arrangement positions of each of the two sets.

12. The current detection apparatus according to claim 7, wherein the 2n current path arrangement positions are set as two sets of n current path arrangement positions that are arranged line-symmetrically to each other, and the current paths corresponding to n-phase windings of each of the two sets of n-phase windings are arranged at the n current path arrangement positions of each of the two sets.

13. The current detection apparatus according to claim 11, wherein phases of currents flowing in n current paths arranged in the n current path arrangement positions of one set are advanced by 2π/n rad in order in a circular direction with respect to the same circle where the n current path arrangement positions are set, and phases of currents flowing in n current paths arranged in the n current path arrangement positions of the other one set are delayed by 2π/n rad in order in the circular direction.

14. The current detection apparatus according to claim 3, wherein the 2n current path arrangement positions are two sets of n current path arrangement positions corresponding to current paths for the two sets of n-phase windings, the n current path arrangement positions of one set are on the same circle and the n current path arrangement positions of the other one set are on a concentric circle having a radius different from that of the same circle, and arrangement angles for adjacent current path arrangement positions with respect to a center of the concentric circle are set to be the same.

15. The current detection apparatus according to claim 1, wherein windings with the 2n phases are made up of a set of 2n-phase windings.

16. The current detection apparatus according to claim 1, wherein the 2n current path arrangement positions are arranged as current path arrangement positions where two adjacent arrangement positions are provided at each of n positions.

17. A manufacturing method for a current detection apparatus that has magnetic sensors each disposed to face each of current paths for each of windings with 2n phases (n is a multiple of three) in an AC rotating machine, the manufacturing method for the current detection apparatus comprising the steps of:

setting 2n current path arrangement positions as positions for setting 2n current paths in which each of the magnetic sensors is disposed to face each of the 2n current paths;

assigning each of the 2n current paths to which each of the magnetic sensors is disposed to face, at each of the 2n current path arrangement positions that are set, so as to satisfy at least one of a first condition and a second condition, wherein, in a case where a detection current $i_{ks}$ that is detected by a magnetic sensor disposed to face a current path of a k-phase is represented by Formula (b) using a current $I_l$ of an l-phase (l=1 to 2n) being a l-th phase out of the 2n phases and using $a_{l\_k}$ that is a coupling coefficient between a current path of the l-phase and the magnetic sensor disposed to face the current path of the k-phase (k=1 to 2n) being the k-th phase out of the 2n phases, $$i_{ks} = \sum_{l=1}^{2n} a_{l\_k} \times I_l \ (k = 1 \sim 2n) \quad (b)$$

and in a d-axis sum current and a q-axis sum current that are currents obtained by performing a dq-transformation into a two-axis coordinate system on 2n detection currents $i_{ks}$ on an assumption that all amplitudes of $I_l$ are the same, and when each of a DC component and an AC component in the sum currents is represented collectively with each of terms expressed by sine functions with different phases to one another, the first condition is a condition in which, at least in one of the terms, an amplitude in the one term corresponding to one of error components is reduced by cancellation among coefficients $a_{l\_k}$ included in the one term, where l≠k, and the second condition is a condition in which the error components are reduced by cancellation among values of the terms of sine functions with different phases; and arranging each of the current paths to which each of the magnetic sensors is disposed to face, at the current path arrangement positions assigned in the step of assigning each of the 2n current paths.

18. The manufacturing method for the current detection apparatus according to claim 17, wherein, using an error $\delta_d$ and an error $\delta_q$ determined on a basis of accuracy of an output torque or an output torque ripple of the AC rotating machine, an error component of the d-axis sum current $\Delta I_d$ satisfies $|\Delta I_d|<\delta_d$ or an error component of the q-axis sum current $\Delta I_q$ satisfies $|\Delta I_q|<\delta_d$.

19. The manufacturing method for the current detection apparatus according to claim 17, wherein the windings with 2n phases are made up of two sets of n-phase windings.

20. The manufacturing method for the current detection apparatus according to claim 19, wherein a phase difference between the two sets of n-phase windings is π/6 rad.

21. The manufacturing method for the current detection apparatus according to claim 19, wherein a phase difference between the two sets of n-phase windings is zero.

22. The manufacturing method for the current detection apparatus according to claim 19, wherein a phase difference between the two sets of n-phase windings is π/3 rad.

23. The manufacturing method for the current detection apparatus according to claim 19, wherein, in the step of setting 2n current path arrangement positions, the 2n current path arrangement positions are set on the same circle.

24. The manufacturing method for the current detection apparatus according to claim 23, wherein a center of the same circle is set at a position of a rotor axis in the AC rotating machine.

25. The manufacturing method for the current detection apparatus according to claim 23, wherein, in the step of setting 2n current path arrangement positions, the 2n current path arrangement positions are set at equal intervals.

26. The manufacturing method for the current detection apparatus according to claim 23, wherein, in the step of setting 2n current path arrangement positions, the 2n current path arrangement positions are set as two sets of n current path arrangement positions, the n current path arrangement positions being arranged at equal intervals, and in the step of assigning each of the 2n current paths, the current paths corresponding to n-phase windings of each of the two sets of n-phase windings are arranged at the n current path arrangement positions of each of the two sets.

27. The manufacturing method for the current detection apparatus according to claim 23, wherein, in the step of setting 2n current path arrangement positions, the 2n current path arrangement positions are set as two sets of n current path arrangement positions that are arranged point-symmetrically to each other, and in the step of assigning each of the 2n current paths, the current paths corresponding to n-phase windings of each of the two sets of n-phase windings are arranged at the n current path arrangement positions of each of the two sets.

28. The manufacturing method for the current detection apparatus according to claim 23, wherein, in the step of setting 2n current path arrangement positions, the 2n current path arrangement positions are set as two sets of n current path arrangement positions that are arranged line-symmetrically to each other, and in the step of assigning each of the 2n current paths, the current paths corresponding to n-phase windings of each of the two sets of n-phase windings are assigned at the n current path arrangement positions of each of the two sets.

29. The manufacturing method for the current detection apparatus according to claim 27, wherein, in the step of assigning each of the 2n current paths, n current paths are assigned in such a manner that phases of currents flowing in the n current paths assigned in the n current path arrangement positions of one set are advanced by 2π/n rad in a circular direction with respect to the same circle where the n current path arrangement positions are set, and n current paths are assigned in such a manner that phases of currents flowing in the n current paths assigned in the n current path arrangement positions of the other one set are delayed by $2\pi/n$ rad in order in the circular direction.

30. The manufacturing method for the current detection apparatus according to claim 19, wherein, in the step of setting 2n current path arrangement positions, the 2n current path arrangement positions are two sets of n current path arrangement positions corresponding to current paths for the two sets of n-phase windings, the n current path arrangement positions of one set are on the same circle and the n current path arrangement positions of the other one set are on a concentric circle having a radius different from that of the same circle, and arrangement angles for adjacent current path arrangement positions with respect to a center of the concentric circle are set to be the same.

31. The manufacturing method for the current detection apparatus according to claim 17, wherein windings with the 2n phases are made up of a set of 2n-phase windings.

32. The manufacturing method for the current detection apparatus according to claim 17, wherein, in the step of setting 2n current path arrangement positions, the 2n current path arrangement positions are arranged as current path arrangement positions where two adjacent arrangement positions are provided at each of n positions.

* * * * *